United States Patent
Kyozuka et al.

(10) Patent No.: US 9,142,524 B2
(45) Date of Patent: Sep. 22, 2015

(54) SEMICONDUCTOR PACKAGE AND METHOD FOR MANUFACTURING SEMICONDUCTOR PACKAGE

(75) Inventors: Masahiro Kyozuka, Nagano (JP); Akihiko Tateiwa, Nagano (JP); Masato Tanaka, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 164 days.

(21) Appl. No.: 13/354,663

(22) Filed: Jan. 20, 2012

(65) Prior Publication Data

US 2012/0187557 A1 Jul. 26, 2012

(30) Foreign Application Priority Data

Jan. 25, 2011 (JP) .................. 2011-013180

(51) Int. Cl.
*H01L 23/48* (2006.01)
*H01L 23/00* (2006.01)
*H01L 25/10* (2006.01)

(52) U.S. Cl.
CPC .............. *H01L 24/19* (2013.01); *H01L 24/20* (2013.01); *H01L 25/105* (2013.01); *H01L 2224/12105* (2013.01); *H01L 2225/1035* (2013.01); *H01L 2225/1058* (2013.01); *H01L 2924/014* (2013.01); *H01L 2924/01006* (2013.01); *H01L 2924/01012* (2013.01); *H01L 2924/01013* (2013.01); *H01L 2924/01029* (2013.01); *H01L 2924/01033* (2013.01); *H01L 2924/01038* (2013.01); *H01L 2924/01047* (2013.01); *H01L 2924/01051* (2013.01); *H01L 2924/01079* (2013.01);

(Continued)

(58) Field of Classification Search
CPC ................ H01L 2924/00; H01L 2224/32225; H01L 2224/16225; H01L 2224/73267
USPC .......... 257/773, 787, 788, 789, 790, 794, 795
See application file for complete search history.

(56) References Cited

U.S. PATENT DOCUMENTS 7,183,639 B2 * 2/2007 Mihara et al. ................. 257/690
7,968,427 B2 6/2011 Sugiyama et al.
(Continued)

FOREIGN PATENT DOCUMENTS

JP 2006-339412 12/2006
JP 2008-257710 10/2008
(Continued)

OTHER PUBLICATIONS

Office Action dated Sep. 16, 2014 issued with respect to the basic Japanese Application No. 2011-013180.

(Continued)

*Primary Examiner* — Jaehwan Oh
(74) *Attorney, Agent, or Firm* — IPUSA, PLLC

(57) ABSTRACT

A semiconductor package includes a semiconductor chip including a circuit forming surface and a side surface, and a sealing insulation layer that seals the circuit forming surface and the side surface of the semiconductor chip, the sealing insulation layer having a first surface on a side of the circuit forming surface. At least one wiring layer and at least one insulation layer are formed one on top of the other on the first surface. The wiring layer formed on the first surface is electrically connected to the semiconductor chip. The insulation layer has a reinforcement member installed therein.

20 Claims, 28 Drawing Sheets

(52) U.S. Cl.
CPC ............... *H01L2924/01082* (2013.01); *H01L 2924/15311* (2013.01); *H01L 2924/18162* (2013.01); *H01L 2924/3511* (2013.01)

(56) References Cited

U.S. PATENT DOCUMENTS

| | | | |
|---|---|---|---|
| 8,035,217 B2* | 10/2011 | Mori et al. | 257/700 |
| 8,129,626 B2 | 3/2012 | Ueda et al. | |
| 8,207,606 B2* | 6/2012 | Shin | 257/700 |
| 8,552,418 B2 | 10/2013 | Sugiyama et al. | |
| 2007/0099409 A1* | 5/2007 | Mihara et al. | 438/597 |
| 2007/0119619 A1* | 5/2007 | Nakamura et al. | 174/262 |
| 2007/0262469 A1* | 11/2007 | 'Khng et al. | 257/782 |
| 2008/0157330 A1* | 7/2008 | Kroehnert et al. | 257/686 |
| 2008/0168652 A1* | 7/2008 | Koyama et al. | 29/830 |
| 2008/0184555 A1* | 8/2008 | Machida | 29/830 |
| 2008/0224940 A1* | 9/2008 | Sugiyama et al. | 343/873 |
| 2008/0224941 A1* | 9/2008 | Sugiyama et al. | 343/873 |
| 2008/0303136 A1* | 12/2008 | Mori et al. | 257/700 |
| 2010/0013077 A1* | 1/2010 | Shin | 257/690 |
| 2010/0044845 A1 | 2/2010 | Funaya et al. | |
| 2011/0099806 A1* | 5/2011 | Koyama et al. | 29/849 |
| 2011/0104858 A1* | 5/2011 | Katagiri et al. | 438/121 |
| 2011/0121445 A1* | 5/2011 | Mori et al. | 257/693 |
| 2011/0155433 A1* | 6/2011 | Funaya et al. | 174/258 |
| 2011/0215478 A1* | 9/2011 | Yamamichi et al. | 257/773 |
| 2011/0227214 A1* | 9/2011 | Tateiwa et al. | 257/734 |

FOREIGN PATENT DOCUMENTS

| | | |
|---|---|---|
| JP | 2008-300854 | 12/2008 |
| JP | 2008-306071 | 12/2008 |
| JP | 2009-224739 | 10/2009 |
| WO | 2007/126090 | 11/2007 |
| WO | 2010/010910 | 1/2010 |

OTHER PUBLICATIONS

Office Action mailed on Dec. 9, 2014 issued with respect to the basic Japanese Patent Application No. 2011-013180.

* cited by examiner

SEMICONDUCTOR PACKAGE AND METHOD FOR MANUFACTURING SEMICONDUCTOR PACKAGE

CROSS-REFERENCE TO RELATED APPLICATIONS

This application is based upon and claims the benefit of priority of the prior Japanese Patent Application No. 2011-013180 filed on Jan. 25, 2011, the entire contents of which are incorporated herein by reference.

FIELD

The embodiments discussed herein are related to a semiconductor package and a method for manufacturing the semiconductor package.

BACKGROUND

Conventionally, there is proposed a semiconductor package having a semiconductor chip installed therein. The semiconductor package includes, for example, a first insulation layer, a first wiring layer, an another one of plural insulation layers, and a second wiring layer (see, for example, Japanese Laid-Open Patent Publication No. 2008-306071). The first insulation is formed to seal a circuit forming plane of the semiconductor chip (plane on which an electrode pad is provided) and a side plane of the semiconductor chip. The first wiring layer is layered on the first insulation layer and electrically connected to the electrode pad of the semiconductor chip. Another one of the plural insulation layers is layered on the first wiring layer.

With the conventional configuration of the semiconductor package, the semiconductor chip is only installed in the first insulation layer provided on one side of the semiconductor package with respect to the thickness direction of the semiconductor package. Due to the conventional configuration of the semiconductor package, the conventional semiconductor package has a problem of warping.

More specifically, in a case where silicon is the main component of the semiconductor chip, the thermal expansion of the semiconductor chip is approximately 3.4 ppm/° C. and Young's modulus of the semiconductor chip is approximately 200 GPa. On the other hand, in a case where an epoxy resin is the main component of the first insulation layer or another one of the plural insulation layers, the thermal expansion of the semiconductor chip is approximately 8-150 ppm/° C. and Young's modulus of the semiconductor chip is approximately 0.03-13 GPa. Due to the difference in the value of the physical properties (e.g., thermal expansion, Young's modulus), even though one side of the first insulation layer (the side in which the semiconductor chip is installed) is resistant to deformation due to, for example, thermal stress, the other side of the insulation layer (the side in which the semiconductor chip is not installed), is easily deformed due to, for example, thermal stress. As a result, warping tends to occur on one side of the insulation layer (the side in which the semiconductor chip is installed) at room temperature (for example, approximately, 20-30° C.) in which one side of the insulation layer becomes a protrusion. Further, warping tends to occur on the one side of the insulation layer at a high temperature (for example, approximately (200-300° C.) in which one side of the insulation layer becomes a recess.

SUMMARY

According to an aspect of the invention, there is provided a semiconductor package including: a semiconductor chip including a circuit forming surface and a side surface; and a sealing insulation layer that seals the circuit forming surface and the side surface of the semiconductor chip, the sealing insulation layer having a first surface on a side of the circuit forming surface; wherein at least one wiring layer and at least one insulation layer are formed one on top of the other on the first surface; wherein the wiring layer formed on the first surface is electrically connected to the semiconductor chip; wherein the insulation layer has a reinforcement member installed therein.

The object and advantages of the invention will be realized and attained by means of the elements and combinations particularly pointed out in the claims.

It is to be understood that both the foregoing generation description and the followed detailed description are exemplary and explanatory and are not restrictive of the invention, as claimed.

DESCRIPTION OF EMBODIMENTS

In the following, embodiments of the present invention will be described with reference to the accompanying drawings.
<First Embodiment>
[Configuration of Semiconductor Package According to the First Embodiment of the Present Invention]

Figure 1:
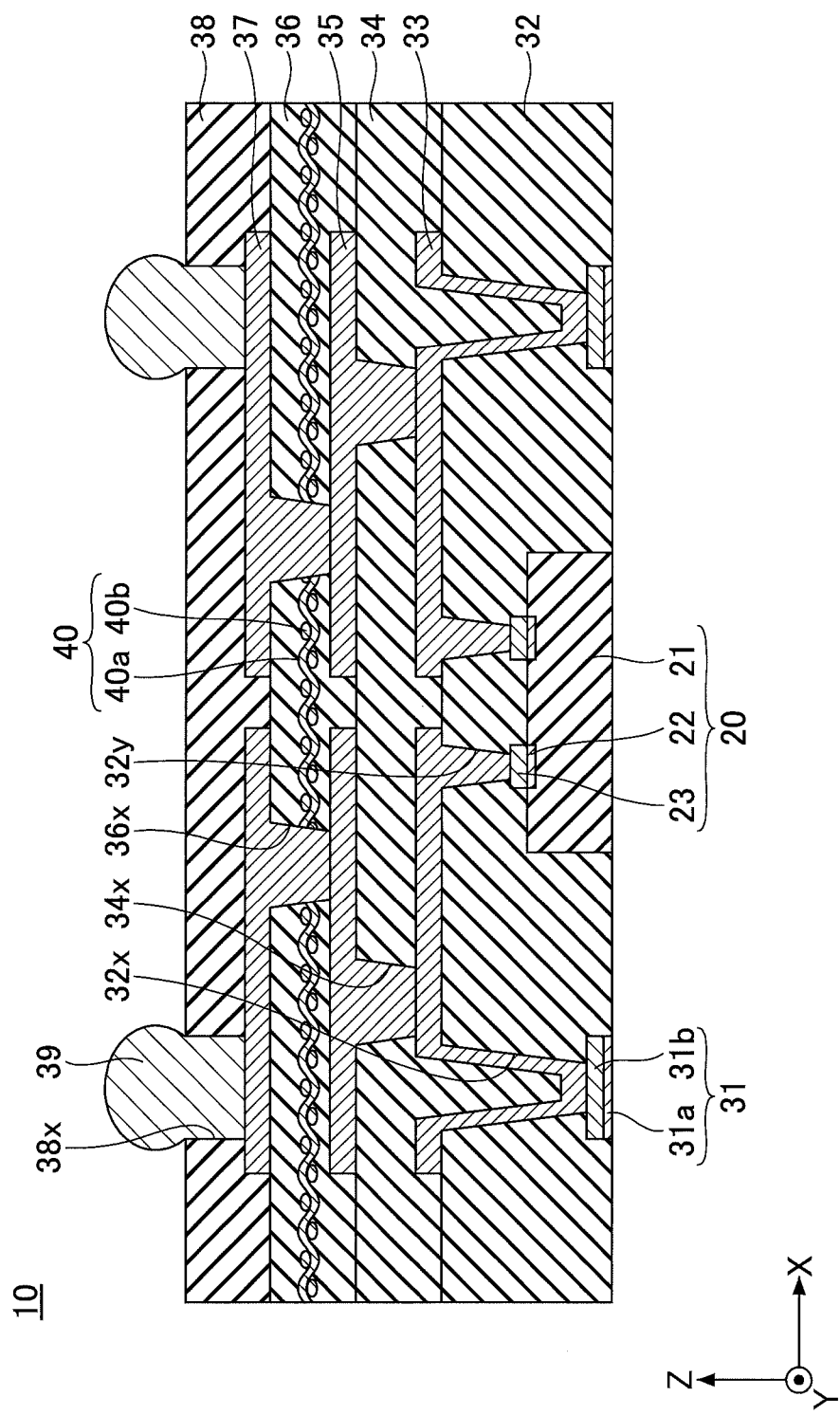
FIG. 1 is a cross-sectional view of a semiconductor package according to a first embodiment of the present invention.

FIG. 1 is a cross-sectional view of a semiconductor package 10 according to the first embodiment of the present invention. With reference to FIG. 1, the semiconductor package 10 includes a semiconductor chip 20, a first wiring layer 31, a first insulation layer 32, a second wiring layer 33, a second insulation layer 34, a third wiring layer 35, a third insulation layer 36, a fourth wiring layer 37, a solder resist layer 38, an external connection terminal 39.

For the sake of convenience, it is to be noted that "down (top)" refers to the side of the first insulation layer 32 (first insulation layer side) and "up (bottom)" refers to the side of the solder resist layer 38 (solder resist layer side). For example, a surface of the first insulation layer 32 that contacts the second insulation layer 34 is a top surface of the first insulation layer 32, and a surface of the first insulation layer 32 that is exposed is a bottom surface.

The plane shape of the semiconductor package 10 may be, for example, a rectangular shape. The size of the rectangular-shaped semiconductor package 10 may be, for example, approximately 12 mm in width (X direction), approximately 12 mm in depth (Y direction), and approximately 0.5 mm in thickness (Z direction). Components of the semiconductor package 10 (e.g., semiconductor chip 20) are described in detail below.

The semiconductor chip 20 includes a semiconductor substrate 21, an electrode pad 22, and a protrusion electrode 23. The plane shape of the semiconductor chip 20 may be, for example, a rectangular shape. The size of the rectangular-shaped semiconductor chip 20 may be, for example, approximately 8 mm in width (X direction), approximately 8 mm in depth (Y direction), and approximately 90 µm in thickness (Z direction).

The semiconductor substrate 21 may be, for example, a substrate including silicon (Si) as a main component and having a semiconductor integrated circuit (not illustrated) formed thereon. The electrode pad 22 is formed on a surface of the semiconductor substrate at a side on which a circuit is to be formed (circuit forming surface side) and is electrically connected to the semiconductor integrated circuit (not illustrated). For example, aluminum (Al) may be used as the material of the electrode pad 22. Alternatively, as for the material of the electrode pad 22, there is, for example, a material having copper (Cu) and aluminum (Al) layered in this order (i.e. aluminum layered on top of copper) or a material having copper (Cu) and silicon (Si) layered in this order (i.e. silicon layered on top of copper).

The protrusion electrode 23 is formed on the electrode pad 22. For example, a circular column-shaped copper (Cu) post may be used as the protrusion electrode 23. The diameter of the protrusion electrode 23 may be, for example, approximately 50 µm. The height of the protrusion electrode 23 may be, for example, approximately 5 to 10 µm. The pitch of the protrusion electrode 23 with respect to an adjacent protrusion electrode 23 may be, for example, 100 µm. Alternatively, the electrode pad 22 may have no protrusion electrode 23 formed thereon. In this case, the electrode pad itself 22 is to be electrically connected directly to the second wiring layer 33.

A surface of the semiconductor chip 20 that is positioned on the opposite side of the circuit forming surface and arranged substantially parallel to the circuit forming surface may also be hereinafter referred to as a "rear surface" of the semiconductor chip 20. Further, a surface of the semiconductor chip 20 that is arranged substantially perpendicular to the circuit forming surface and the rear surface may also be hereinafter referred to as a "side surface".

The circuit forming surface and the side surface of the semiconductor chip 20 are sealed by the first insulation layer 32. The rear surface of the semiconductor chip 20 is exposed at the first insulation layer 32. The rear surface of the semiconductor chip 20 is substantially flush with the bottom surface of the first insulation layer 32.

The first wiring layer 31 includes a first layer 31a and a second layer 31b. A conductive layer may be used as the first layer 31a. The conductive layer may have, for example, a gold (Au) film, a palladium (Pd) film, and a nickel (Ni) film layered in this order (i.e. a Pd film layered on top of a Au film, and a Ni film layer on top of the Pd film) in which the Au film is exposed facing the outside of the semiconductor package 10. A conductive layer including, for example, a copper layer may be used as the second layer 31b. The thickness of the first wiring layer 31 may be, for example, approximately 10-20 µm.

A portion of the first wiring layer 31 (bottom surface of the first layer 31a) is exposed at the first insulation layer 32 and is substantially flush with the bottom surface of the first insulation layer 32 and the rear surface of the semiconductor chip 20. The portion of the first wiring layer 31 (bottom surface of the first layer 31a) functions as an electrode pad that is to be connected to, for example, another semiconductor package, another semiconductor chip, or an electronic device. The portion of the first wiring layer 31 exposed at the first insulation layer 32 may also be hereinafter referred to as a "first electrode pad 31".

It is to be noted that the number of electrode pads 31 illustrated in FIG. 1 is reduced for the sake of convenience. In an actual semiconductor package, plural rows of first electrode pads 31 surround the rear surface of the semiconductor chip 20 to form a frame-like shape from a plane view. The plane shape of the first electrode pad 31 may be, for example, a circular shape. The diameter of the circular-shaped first electrode pad 31 may be, for example, approximately 100-350 µm. The pitch between the first electrode pads may be, for example, approximately 400-500 µm.

The first insulation layer 32 seals the top and the side surfaces of the first wiring layer 31 and the circuit forming surface and the side surface of the semiconductor chip 20. Further, the first insulation layer 32 exposes the bottom surface of the first wiring layer 31 and the rear surface of the semiconductor chip 20. For example, a thermosetting insulating resin having an epoxy resin or a phenol resin as a main component may be used as the material of the first insulation layer 32. The thickness of the first insulation layer 32 is, for example, approximately 150 µm. The first insulation layer 32 may contain a filler such as silica ($SiO_2$). The first insulation layer 32 is one representative example of a sealing insulation layer according to an embodiment of the present invention.

A first via hole 32x and a second via hole 32y are formed in the first insulation layer 32. The first via hole 32x penetrates the first insulation layer 32 and exposes the top surface of the first wiring layer 31. The second via hole 32y penetrates the first insulation layer 32 and exposes the top surface of the protrusion electrode 23. The first via hole 32x is a recess that is open on a side of the second insulation layer 34 (second insulation layer side) and has a circular truncated cone shape in which the area of an opening of the recess is larger than the area of the bottom surface of the recess. The top surface of the first wiring layer 31 forms the bottom surface of the recess. The diameter of the opening of the first via hole 32x may be, for example, approximately 150 µm. The second via hole 32y is also a recess that is open on the second insulation layer side and has a circular truncated cone shape in which the area of an opening of the recess is larger than the area of the bottom surface of the recess. The top surface of the protrusion electrode 23 forms the bottom surface of the recess. The diameter of the opening of the second via hole 32y may be, for example, approximately 30 µm.

The second wiring layer 33 is formed on the first insulation layer 32. The second wiring layer 33 includes a first via wiring (penetration wiring), a second via wiring (penetration wiring), and a wiring pattern. The first via wiring is formed on a side wall of the first via hole 32x and the top surface of the first wiring layer 31. The second via wiring fills the inside of the second via hole 32y. The wiring pattern of the second wiring layer 33 is formed on the first insulation layer 32. The second wiring layer 33 is electrically connected to the first wiring layer 31 exposed at a bottom part of the first via hole 32x and the protrusion electrode 23 exposed at a bottom part of the second via hole 32y. For example, copper (Cu) may be used as the material of the second wiring layer 33. The wiring pattern of the second wiring layer 33 may have a thickness of, for example, approximately 10-20 μm.

For example, in a case where the thickness of the first insulation layer 32 is 150 μm, and the thickness of the first wiring layer 31 is 10 μm, the depth of the first via hole 32x would be 140 μm. Thereby, it would be difficult to fill the first via hole 32x with the first via wiring. Therefore, the first via wiring does not fill the inside of the first via hole 32x but is instead formed as a film on the side wall of the first via hole 32x and the top surface of the first wiring layer 31. On the other hand, in a case where the thickness of the first insulation layer 32 is 150 μm, and the thickness of the semiconductor chip 20 (including the height of the protrusion electrode 23) is 100 μm, the depth of the second via hole 32y would be 50 μm. Thereby, the second via hole 32y would be significantly shallower than the first via hole 32x. Therefore, the second via wiring fills inside of the second via hole 32y.

The second insulation layer 34 is formed on the first insulation layer 32, so that the second insulation layer 34 covers the second wiring layer 33. The material of the second insulation layer may be the same insulating resin used for the first insulation layer 32. The thickness of the second insulation layer 34 may be, for example, approximately 15-35 μm. The second insulation layer 34 may include a filler such as silica ($SiO_2$).

The third wiring layer 35 is formed on the second insulation layer 34. The third wiring layer 35 includes a via wiring and a wiring pattern. The via wiring of the third wiring layer 35 fills the inside of a third via hole 34x that penetrates the second insulation layer 34 and exposes the top surface of the second wiring layer 33. The wiring pattern of the third wiring layer 35 is formed on the second insulation layer 34. The third via hole 34x is a recess that is open on a side of the third insulation layer 36 (third insulation layer side) and has a circular truncated cone shape in which the area of an opening of the recess is larger than the area of the bottom surface of the recess. The top surface of the second wiring layer 33 forms the bottom surface of the recess. Further, the via wiring of the third wiring layer 35 is formed inside the recess of the third via hole 34x.

The third wiring layer 35 is electrically connected to the second wiring layer 33 exposed at a bottom part of the third via hole 34x. For example, copper (Cu) is used as the material of the third wiring layer 35. The thickness of the wiring pattern of the third wiring layer 35 may be, for example, approximately 10-20 μm.

The third insulation layer 36 is formed on the second insulation layer 34 so that the third insulation layer 36 covers the third wiring layer 35. The third insulation layer 36 has a glass cloth 40 installed therein. More specifically, the third insulation layer 36 is a layer that has, for example, an insulating resin impregnated in the glass cloth 40. The insulating resin of the third insulating layer 36 may include, for example, an epoxy resin as a main component. The thickness of the third insulation layer 36 may be, for example, approximately 50-70 μm. The third insulation layer 36 may include a filler such as silica ($SiO_2$).

Figure 2:
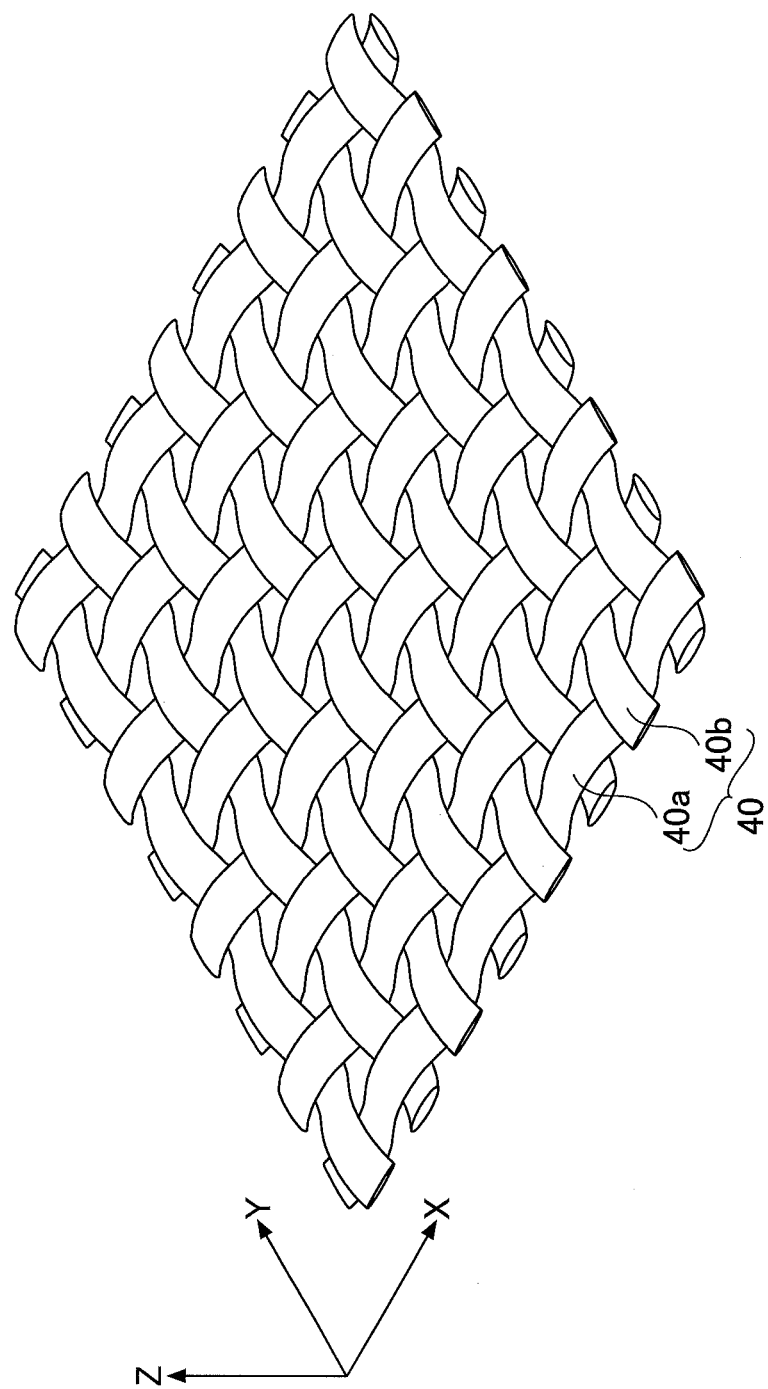
FIG. 2 is a perspective view illustrating an insulation layer having a glass cloth installed therein according to an embodiment of the present invention.

With reference to FIGS. 1 and 2, the glass cloth 40 includes a bundle of glass fibers (glass fiber bundle) 40a arranged in the X direction and another bundle of glass fibers (glass fiber bundle) 40b arranged in the Y direction. The glass fiber bundle 40a and the glass fiber bundle 40b are plain woven to form a matrix-like pattern. The glass cloth 40 is a representative example of a reinforcement member according to an embodiment of the present invention. Both the glass fiber bundle 40a and the glass fiber bundle 40b may be formed with a width of approximately several hundred μm by bundling plural glass fibers together in which each of the glass fibers has a diameter of approximately several μm. The thickness of both the glass fiber bundle 40a and the glass fiber bundle 40b may be, for example, approximately 10-15 μm.

The reason for providing the glass cloth 40 inside the third insulation layer 36 is as follows. As described above, in a case where a semiconductor chip is installed only in one side of a semiconductor package in the thickness direction, there is a problem that warping may occur in the semiconductor package. In the semiconductor package 10, although the semiconductor chip 20 is installed in the side of the first insulation layer 32 (one side of the semiconductor package 10), there is no semiconductor chip installed in the side of the third insulation layer 36 (other side of the semiconductor package 10).

If no measure is taken (i.e. if the glass cloth 40 is not installed in the third insulation layer 36), the semiconductor package 10 may face the same problem of warping as the conventional semiconductor package due to, for example, the difference in the value of the physical properties (e.g., thermal expansion, Young's modulus) between the first insulation layer 32 having the semiconductor chip 20 installed therein and the third insulation layer 36 being formed only of an insulating resin. Particularly, in an atmosphere of approximately 260° C. where the third insulation layer 36 is formed only of an insulating resin, it becomes difficult for the semiconductor package 10 to maintain strength because the temperature of the third insulation layer 36 surpasses the glass transition temperature of the third insulation layer 36 and the thermal expansion coefficient of the third insulation layer 36 becomes significantly large. As a result, significant warping may occur.

Therefore, the glass cloth 40 is installed inside the third insulation layer 36 on the other side of the semiconductor package 10. The glass cloth 40 includes, for example, silicon dioxide ($SiO_2$) as a main component and a metal compound (e.g., sodium oxide ($Na_2O$), magnesium oxide (MgO)) as an accessory component. Accordingly, the thermal expansion coefficient of the glass cloth 40 can be adjusted by adjusting the amount of silicon dioxide ($SiO_2$) contained in the glass cloth 40. The glass cloth 40 exhibits a thermal expansion coefficient closer to that of silicon as the silicon dioxide ($SiO_2$) content is increased. Further, the Young's modulus of the glass cloth 40 can be adjusted by selecting the diameter of the glass fiber of the glass cloth 40 and/or the method of weaving the glass fibers of the glass cloth.

For example, the thermal expansion coefficient of the third insulation layer 36 being formed only of epoxy resin (having no glass cloth 40 installed therein) is approximately 40 ppm/° C. in an atmosphere of 25° C., and is approximately 120 ppm/° C. in an atmosphere of 260° C. On the other hand, the thermal expansion coefficient of the third insulation layer 36 having the glass cloth 40 installed therein is approximately 20 ppm/° C. in an atmosphere of 25° C., and is approximately 10 ppm/° C. in an atmosphere of 260° C.

In other words, compared to a case where the third insulation layer 36 is only formed of an insulating resin, the values of the physical properties (e.g., thermal expansion coefficient, Young's modulus) on the other side of the semiconductor package 10 become closer to the values of the physical properties on the side of the first insulation layer 32 having the semiconductor chip 20 installed therein (i.e. the one side of the semiconductor package 10) by installing the glass cloth 40 in the third insulation layer 36 on the other side of the semiconductor package 10. Further, unlike the case where the third insulation layer 36 is only formed of an insulating resin, the third insulation layer 36 having the glass cloth 40 installed therein can maintain strength even in an atmosphere of approximately 260° C. As a result, the semiconductor package 10 can be prevented from being warped by, for example, thermal stress. Further, because the rigidity of the entire semiconductor package 10 can be improved, the semiconductor package 10 can maintain a consistent shape.

Although the reinforcement member in the above-described embodiment is a glass cloth 40 formed of glass fiber bundles 40a, 40b, a reinforcement member other than the glass cloth 40 may be used. For example, the reinforcement member may be formed of carbon fiber bundles, polyester fiber bundles, tetron fiber bundles, nylon fiber bundles, or aramid fiber bundles. Further, the method of weaving the fiber bundles of the reinforcement member is not limited to plain weaving. For example, the fibers of the reinforcement member may be woven by a satin weaving method or a twill weaving method. Further, other than using a woven fabric for the reinforcement member, a non-woven fabric may also be used for the reinforcement member.

Returning to FIG. 1, the fourth wiring layer 37 is formed on the third insulation layer 36. The fourth wiring layer 37 includes a via wiring and a wiring pattern. The via wiring of the fourth wiring layer 37 fills the inside of a fourth via hole 36x that penetrates the third insulation layer 36 and exposes the top surface of the third wiring layer 35. The wiring pattern of the fourth wiring layer 37 is formed on the second insulation layer 34. The fourth via hole 36x is a recess that is open on a side of the solder resist layer 38 (solder resist layer side) and has a circular truncated cone shape in which the area of an opening of the recess is larger than the area of the bottom surface of the recess. The top surface of the third wiring layer 35 forms the bottom surface of the recess. Further, the via wiring of the fourth wiring layer 37 is formed inside the recess of the fourth via hole 36x.

The fourth wiring layer 37 is electrically connected to the third wiring layer 35 exposed at the bottom part of the fourth via hole 36x. For example, copper (Cu) may be used as the material of the fourth wiring layer 37. The thickness of the wiring pattern of the fourth wiring layer 37 may be, for example, approximately 10-20 µm.

The solder resist layer 38 is an insulation layer that is formed on the third insulation layer 36 so that the solder resist layer 38 covers the fourth wiring layer 37. The thickness of the solder resist layer 38 may be, for example, approximately 15-35 µm. The solder resist layer 38 may include a filler such as silica ($SiO_2$). The solder resist layer 38 includes an opening 38x. A part of the fourth wiring layer 37 is exposed at a bottom part of the opening 38x. According to necessity, a metal layer may be formed on the part of the fourth wiring layer 37 exposed at the bottom part of the opening 38x. The metal layer may be, for example, an Au layer, a Ni/Au (a metal layer including a Ni layer and an Au layer layered in this order), or a Ni/Pd/Au layer (a metal layer including a Ni layer, a Pd layer, and a Au layer layered in this order). It is to be noted that the solder resist layer may also be hereinafter simply referred to as "insulation layer".

The external connection terminal 39 is formed on the part of the fourth wiring layer 37 exposed at the bottom part of the opening 38x. In a case where a metal layer is formed on the part of the fourth wiring layer 37 exposed at the bottom part of the opening 38x, the external connection terminal 39 is formed on the metal layer. In this embodiment, the semiconductor package has a so-called fan-out structure in which an area where the external connection terminal 39 is formed is expanded to a periphery of an area directly above the semiconductor chip 20. The pitch between adjacent external connection terminals 39 may be greater than the pitch between adjacent protrusion electrodes 23 (e.g., approximately 100 µm). Alternatively, the semiconductor package 10 may have a so-called fan-in structure depending on purpose.

The external connection terminal 39 functions as a terminal to be electrically connected to, for example, a pad of a mount board (e.g., motherboard) or a pad of another semiconductor package (not illustrated). For example, a solder ball may be used as the external connection terminal 39. For example, an alloy including Pb, an alloy including Sn and Cu, an alloy including Sn and Sb, an alloy including Sn and Ag, or an alloy including Sn, Ag, and Cu may be used as the material of the solder ball. Alternatively, a lead pin may be used as the external connection terminal 39.

Although the external connection terminal 39 is formed in the part of the fourth wiring layer 37 exposed at the bottom part of the opening 38x in the above-described embodiment, the external connection terminal 39 does not always need to be formed. In a case of not forming the external connection terminal 39, the part of the fourth wiring layer 37 itself exposed at the bottom part of the opening 38x is used as an external connection terminal. In a case of not forming the external connection terminal 39 where a metal layer is formed on the part of the fourth wiring layer 37 exposed at the bottom part of the opening 38x, the metal layer itself is used as an external connection terminal. Thus, the part of the fourth wiring layer 37 needs only to be exposed at the solder resist layer 38 to allow the external connection terminal 39 to be formed according to necessity. The part of the fourth wiring layer 37 exposed at the bottom part of the opening 38x may also be hereinafter referred to as "second electrode pad 37".

It is to be noted that the number of the second electrode pads 37 illustrated in FIG. 1 is reduced for the sake of convenience. In an actual semiconductor package, many second electrode pads 37 may be provided to form an area array. The second electrode pad 37 may have, for example, a circular planar shape. The second electrode pad 37 may have a diameter of, for example, approximately 100-350 µm. The pitch between adjacent second electrode pads 37 may be, for example, approximately 400-500 µm.

[Method for Manufacturing Semiconductor Package According to the First Embodiment]

Next, a method for manufacturing a semiconductor package according to the first embodiment of the present invention is described. FIGS. 3-16 are schematic diagrams illustrating steps of the method for manufacturing the semiconductor package according to the first embodiment of the present invention.

Figure 3:
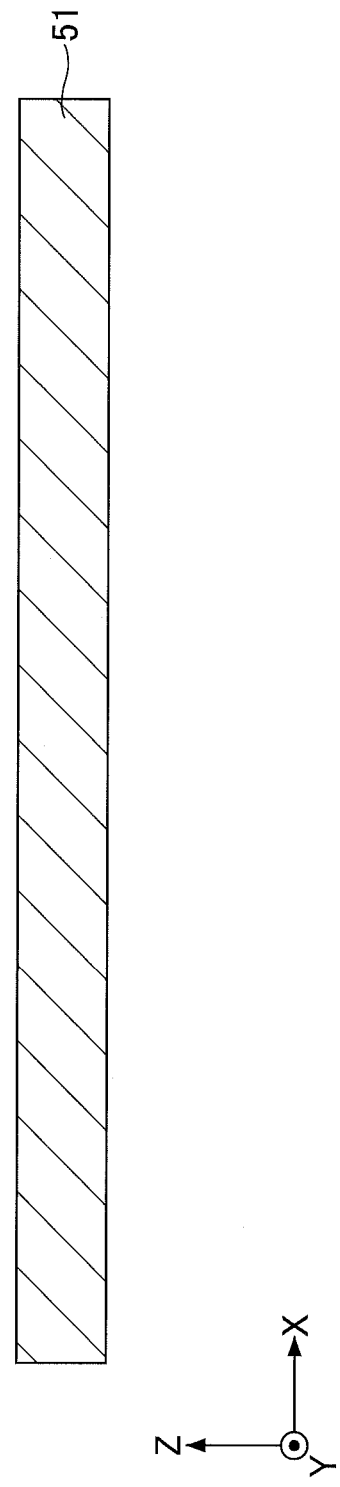
FIGS. 3-16 are schematic diagrams illustrating steps of a method for manufacturing the semiconductor package according to the first embodiment of the present invention.

First, a substrate 51 is prepared in the step illustrated in FIG. 3. For example, a silicon plate, a glass plate, a metal plate, or a metal foil may be used as the substrate 51. In this embodiment, a copper foil is used as the substrate 51. The copper foil is used because the copper foil can be used as a feeding layer when performing an electroplating process, for example, in the below-described step illustrated in FIG. 5 and also because the copper foil can be easily removed by etching in the below-described step illustrated in FIG. 15. The thickness of the substrate 51 may be, for example, approximately 35-100 μm.

Figure 4:
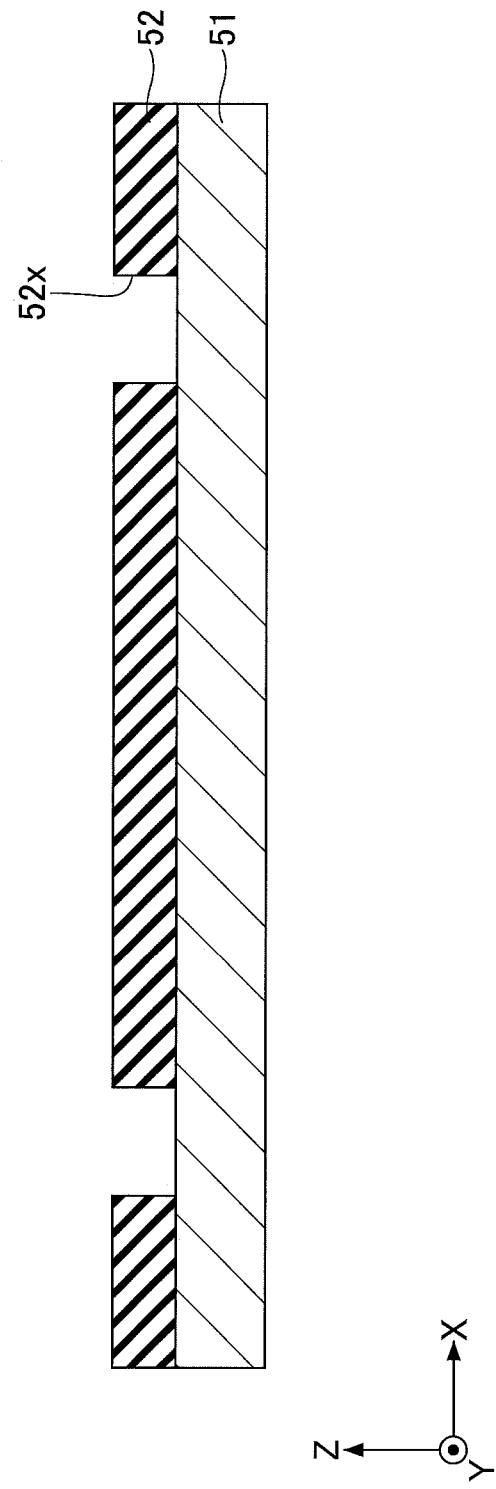

Next, in the step illustrated in FIG. 4, the resist layer 52 has an opening 52x provided on one side of the substrate 51 in correspondence with the first wiring layer 31. More specifically, the one side of the substrate 51 is applied with a liquid-like or a paste-like resist formed of a photosensitive resin composition including, for example, epoxy resin or acrylic resin. Alternatively, the one side of the substrate 51 may be laminated with a film-like resist formed of a photosensitive resin composition including, for example, epoxy resin or acrylic resin (e.g., dry film resist). Then, the opening 52x is formed by performing an exposing process or a developing process on the applied or laminated resin. Thereby, the resist layer 52 including the opening 52x is formed. Alternatively, a film-like resin having the opening 52 formed beforehand may be laminated on one side of the substrate 51. The opening 52x is formed in a corresponding position with respect to the first wiring layer 31 formed in the below-described step illustrated in FIG. 5. The plane shape of the opening 52x is, for example, a circular shape. The diameter of the circular-shaped opening may be, for example, approximately 100-350 μm.

Figure 5:
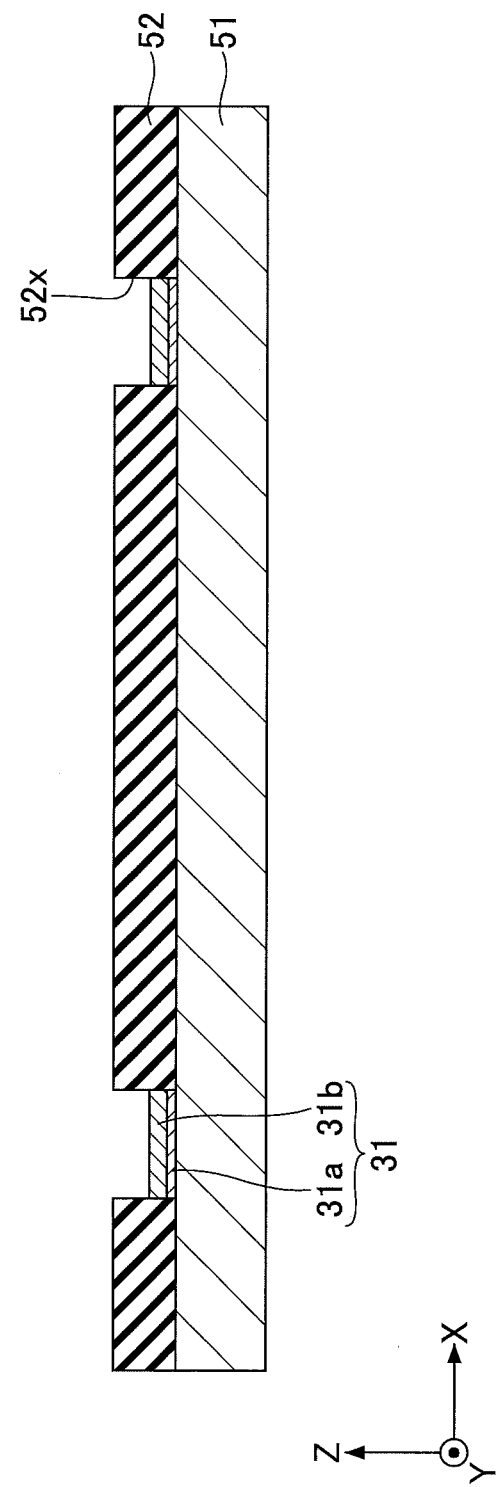

Then, in the step illustrated in FIG. 5, the first wiring layer 31 including the first and the second layers 31a, 31b is formed in the opening 52x on one side of the substrate 51. For example, the first wiring layer 31 is formed by an electroplating method when the substrate 51 is used as a feeding layer. The first layer 31a has a layered configuration in which, for example, a gold (Au) film, a palladium (Pd) film, and a nickel (Ni) film are layered in this order. First, in order to form the first wiring layer 31, the first layer 31a is formed by sequentially forming a gold (Au) film, a palladium (Pd) film, and a nickel (Ni) film with, for example, an electro-plating process where the substrate 51 is used as a feeding layer of the electro-plating process. Then, the second layer 31b formed of, for example, copper (Cu) is formed on the first layer 31a by an electro-plating process where the substrate 51 is used as a feeding layer. Alternatively, the first layer 31a may have a layered configuration including a gold (Au) film and a nickel (Ni) film layered in this order.

Figure 6:
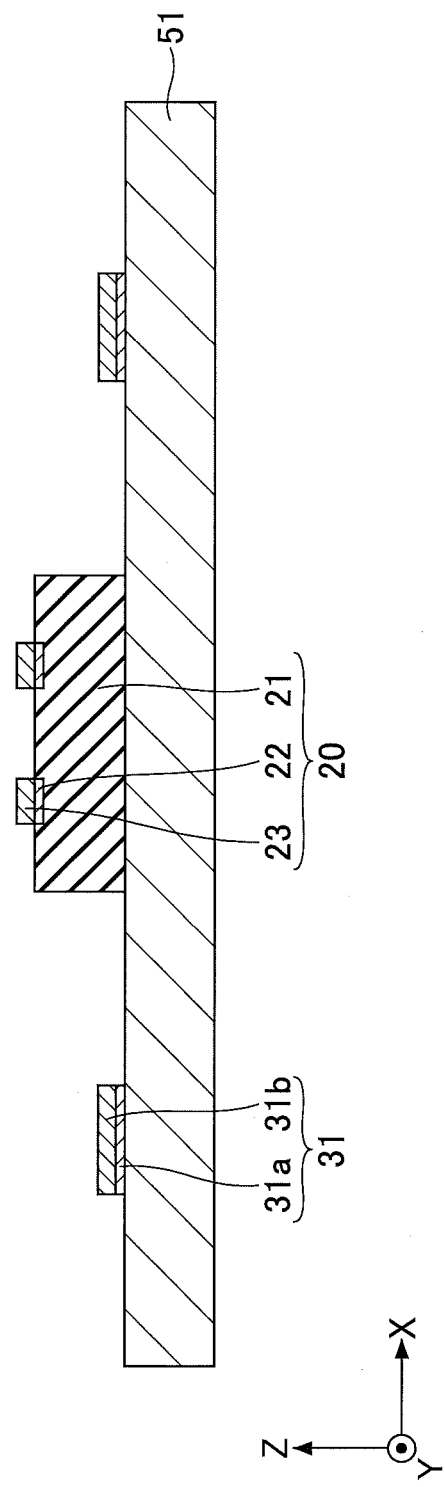

Then, in the step illustrated in FIG. 6, the semiconductor chip 20 is prepared. The semiconductor chip 20 includes the semiconductor substrate 21, the electrode pad 22, and the protrusion electrode 23. The electrode pad 22 and the protrusion electrode 23 are formed on the circuit forming surface side of the semiconductor chip 20. Further, the thickness of the semiconductor chip 20 may be reduced to, for example, approximately 100 μm. Then, after the resist layer 52 illustrated in FIG. 5 is removed, the semiconductor chip 20 is placed on one side of the substrate 51 facing upward (a state where the circuit forming surface of the semiconductor chip 20 is facing upward). The semiconductor chip 20 may be placed on one side of the substrate 51 via an adhesive layer (not illustrated) such as a die-attach film.

Figure 7:
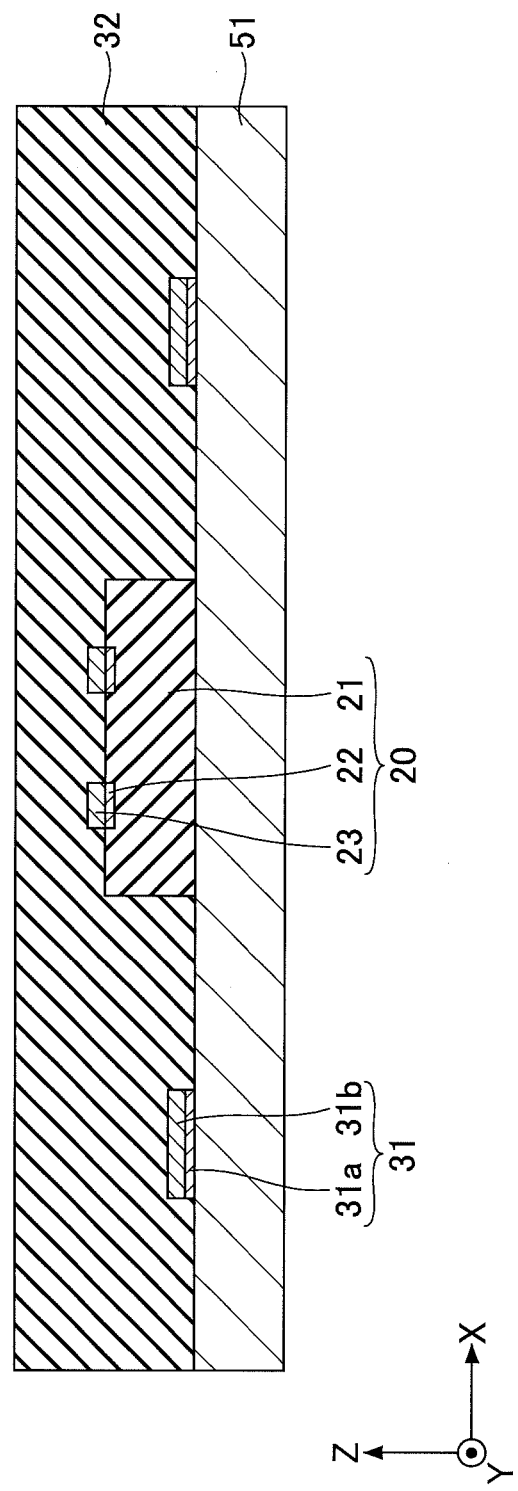

Then, in the step illustrated in FIG. 7, the first insulation layer 32 is formed on one side of the substrate 51. The first insulation layer 32 seals the circuit forming surface and the side surface of the semiconductor chip 20 and the top surface and the side surface of the first wiring layer 31. For example, a thermosetting insulating resin having an epoxy resin or a phenol resin as a main component may be used as the material of the first insulation layer 32. The thickness of the first insulation layer 32 is, for example, approximately 150 μm. The first insulation layer 32 may include a filler such as silica ($SiO_2$).

In a case where a film-like thermosetting insulating resin having an epoxy resin or a phenol resin as a main component is used as the material of the first insulation layer 32, the film-like first insulation layer 32 is laminated on one side of the substrate 51. The laminated first insulation layer 32 seals the circuit forming surface and the side surface of the semiconductor chip 20 and the top surface and the side surface of the first wiring layer 31. The laminated first insulation layer 32 is cured by applying pressure to the first insulation layer 32 while heating the first insulation layer 32 to a temperature equal to or greater than a curing (setting) temperature. It is to be noted that void formation can be prevented by laminating the first insulation layer 32 in a vacuum atmosphere.

In a case where a liquid-like or a paste-like thermosetting insulating resin having an epoxy resin or a phenol resin as a main component is used as the material of the first insulation layer 32, the liquid-like or paste-like first insulation layer 32 is applied on the side of the substrate 51 by, for example, a roll-coating method. The applied first insulation layer 32 seals the circuit forming surface and the side surface of the semiconductor chip 20 and the top surface and the side surface of the first wiring layer 31. The applied first insulation layer 32 is heated to a temperature equal to or greater than a curing (setting) temperature.

Figure 8:
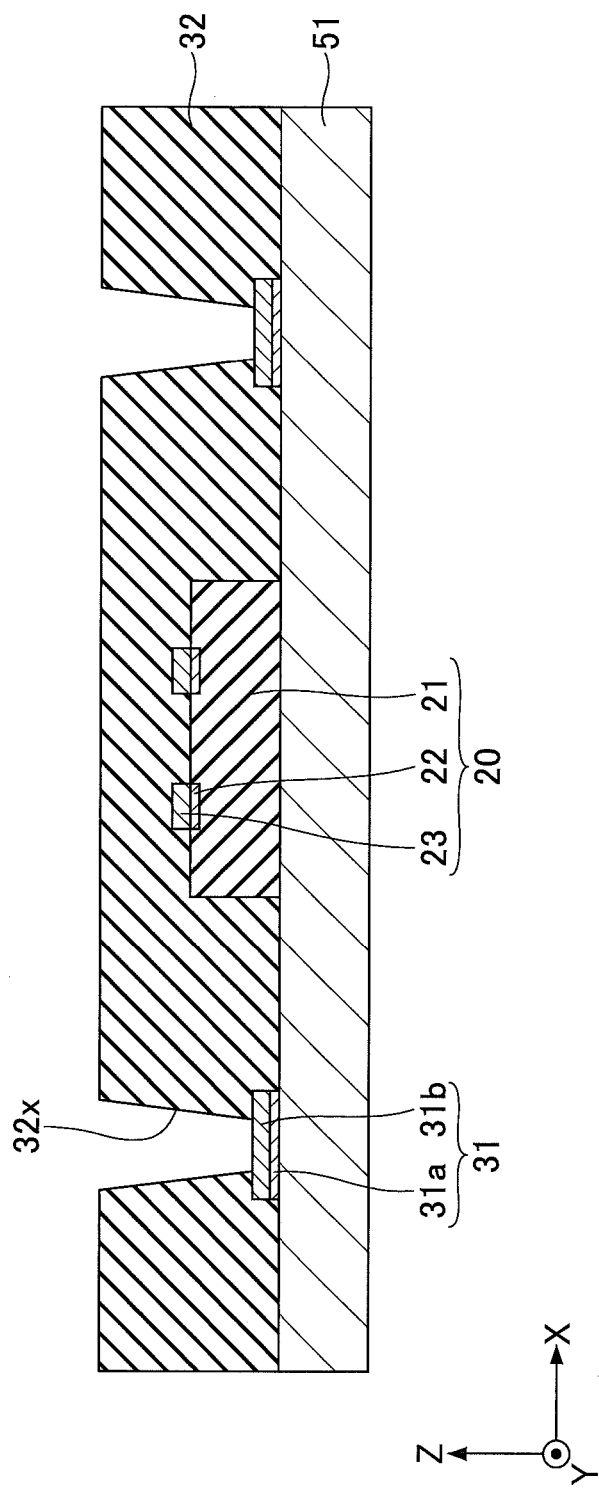

Then, in the step illustrated in FIG. 8, the first via hole 32x is formed in the first insulation layer 32. The first via hole 32x penetrates the first insulation layer 32 and exposes the top surface of the first wiring layer 31. The first via hole 32x may be formed by, for example, a laser processing method using, for example, a $CO_2$ laser. The first via hole 32x, which is formed by the laser processing method, is open on a side of the first insulation layer 32 on which the second insulation layer 34 is to be formed (second insulation layer side). The first via hole 32x is a recess that is open on the second insulation layer side and has a circular truncated cone shape in which the area of an opening of the recess is larger than the area of the bottom surface of the recess. The diameter of the opening of the first via hole 32x may be, for example, approximately 150 μm.

Figure 9:
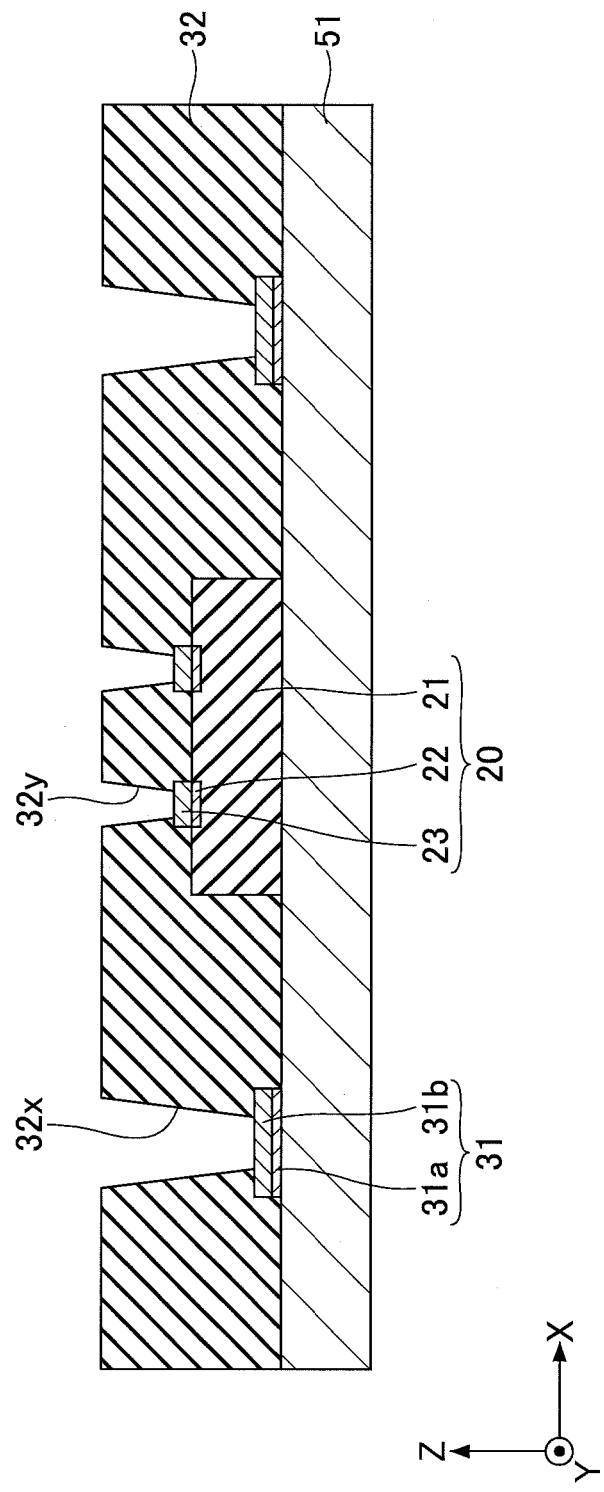

Then, in the step illustrated in FIG. 9, the second via hole 32y is formed in the first insulation layer 32. The second via hole 32y penetrates the first insulation layer 32 and exposes the top surface of the protrusion electrode 23. The second via hole 32y may be formed by, for example, a laser processing method using, for example, an ultraviolet (UV) laser. The second via hole 32y, which is formed by the laser processing method, is open on a side of the first insulation layer 32 on which the second insulation layer 34 is to be formed (second insulation layer side). The second via hole 32y is a recess that is open on the second insulation layer side and has a circular truncated cone shape in which the area of an opening of the recess is larger than the area of the bottom surface of the recess. The diameter of the opening of the second via hole 32y may be, for example, approximately 30 μm.

In a case where both the first and the second via holes 32x, 32y are formed by the laser processing method, it is preferable to perform a desmear process after the step illustrated in FIG. 9 for removing a residual resin of the first insulation layer adhered to the top surface of the first wiring layer 31 exposed at a bottom part of the first via hole 32x and the top surface of the protrusion electrode 23 exposed at a bottom part of the second via hole 32y.

Figure 10:
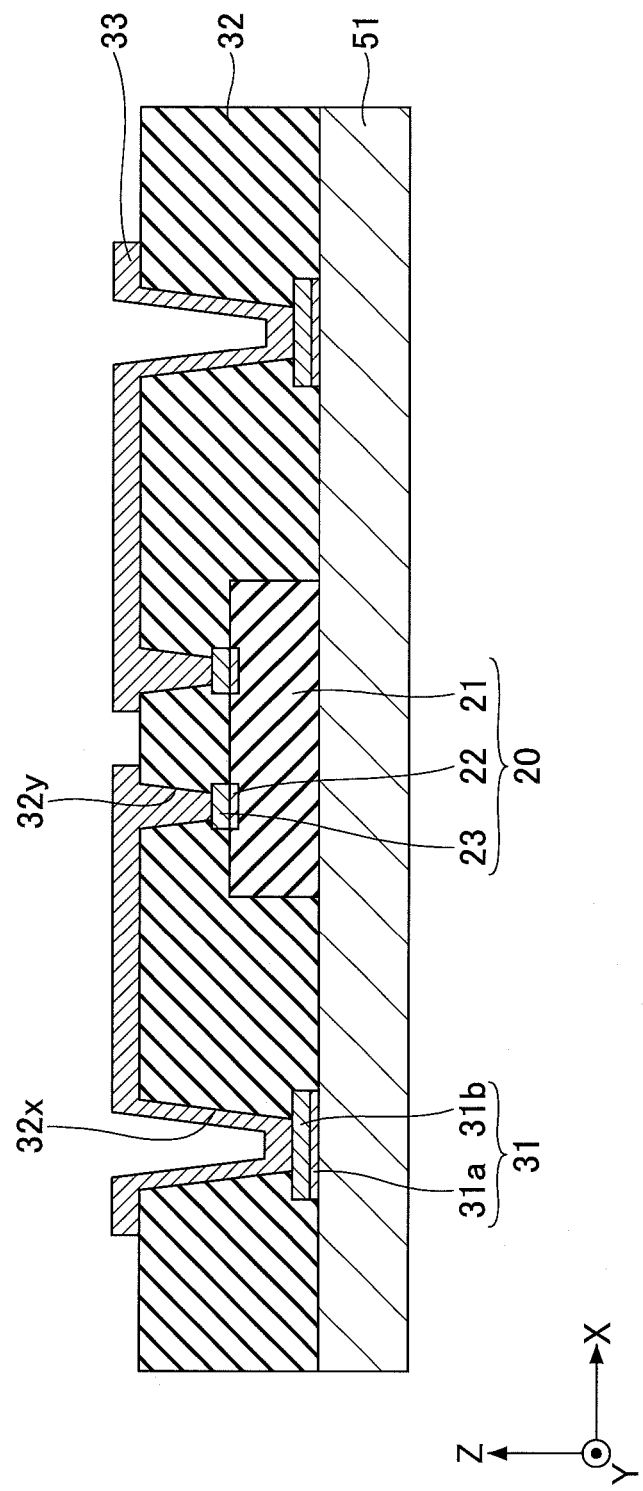

Then, in the step illustrated in FIG. 10, the second wiring layer 33 is formed on the first insulation layer 32. The second wiring layer 33 includes: a first via wiring that is formed on a sidewall of the first via hole 32x and the top surface of the first wiring layer 31; a second via wiring that fills the inside of the second via hole 32y; and a wiring pattern formed on the first insulation layer 32. The second wiring layer 33 is electrically connected to a part of the first wiring layer 31 exposed at the bottom part of the first via hole 32x and the part of the protrusion electrode 23 exposed at the bottom part of the second via hole 32y. For example, the material of the second wiring layer 33 may be, for example, copper (Cu). The thickness of the wiring pattern included in the second wiring layer 33 is, for example, approximately 10-20 μm. Due to the reason described above, although the inside of the first via hole 32x is not filled by the first via wiring, the inside of the second via hole 32y is filled by the second via wiring.

The second wiring layer 33 may be formed by using various wiring forming methods such as a semi-additive method or a subtractive method. In this embodiment, the second wiring layer 33 is formed by using the semi-additive method.

First, a seed layer (not illustrated) is formed on the part of the first wiring layer 31 exposed at the bottom part of the first via hole 32x, the part of the top surface of the protrusion electrode 23 exposed at the bottom part of the second via hole 32y, and the part of the first insulation layer 32 including the sidewall of the first via hole 32x and the sidewall of the second via hole 32y. The seed layer is formed of, for example, copper (Cu). The seed layer is formed by, for example, an electroless plating method or a sputtering method. Then, a resist layer (not illustrated) is formed on the seed layer. The resist layer has an opening formed in correspondence with the second wiring layer 33. Then, a wiring layer (not illustrated) is formed in the opening of the resist layer. The wiring layer is formed of, for example, copper (Cu). The wiring layer is formed by, for example, an electroplating method using the seed layer as a feeding layer. Then, after the resist layer is removed. A portion of the seed layer which is not covered by the wiring layer is removed by etching. Thereby, the second wiring layer 33 including the first via wiring is formed on the sidewall of the first via hole 32x and the top surface of the first wiring layer 31, the second via wiring fills inside of the second via hole 32y, and the wiring pattern is formed on the first insulation layer 32.

Figure 11:
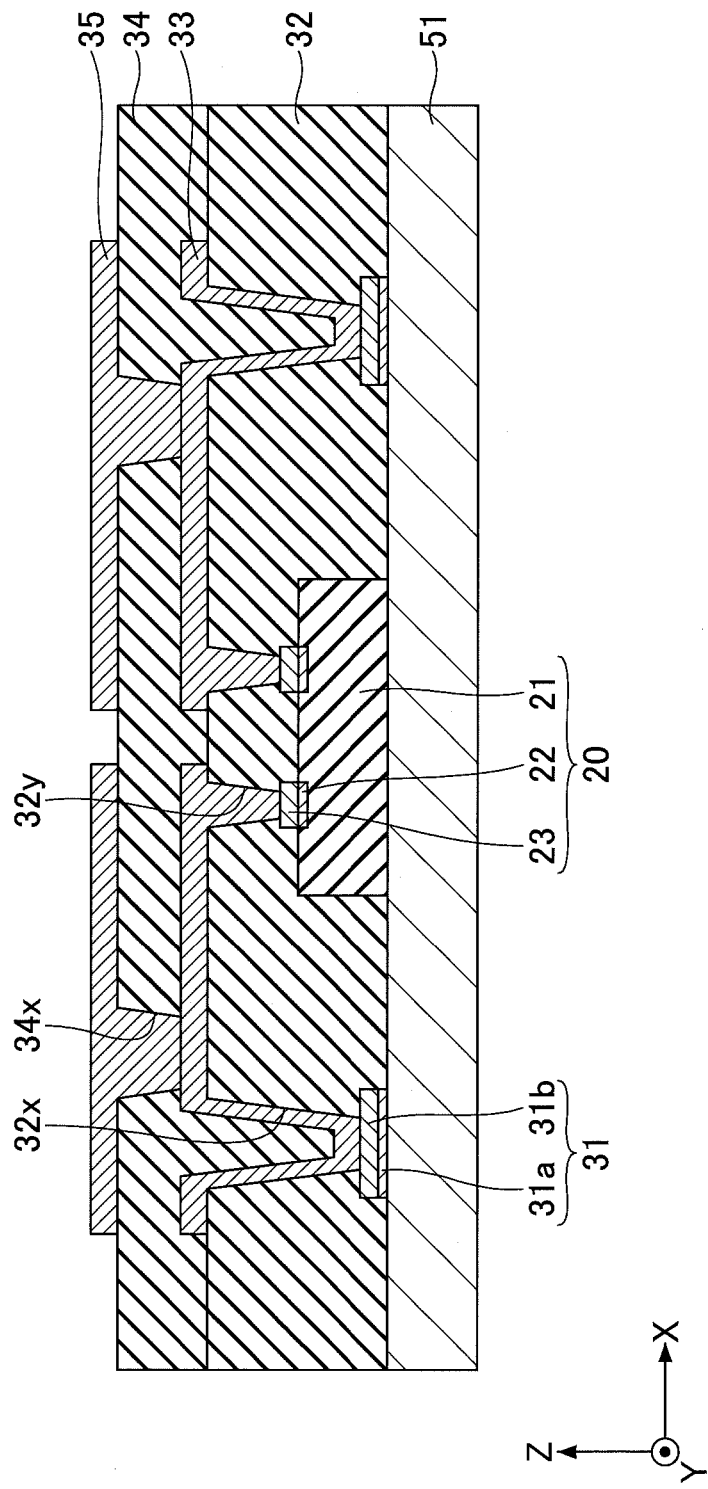

Then, in the step illustrated in FIG. 11, the second insulation layer 34 and the third wiring layer 35 are formed on the first insulation layer 32 by performing substantially the same steps as the steps illustrated in FIGS. 7-10. That is, the second insulation layer 34 covering the second wiring layer 33 is formed on the first insulation layer 32. After forming the second insulation layer 34, the third via hole 34x is formed in the second insulation layer 34. The third via hole 34x penetrates the second insulation layer 34 and exposes the top surface of the second wiring layer 33. The material of the second insulation layer 34 may be the same insulating resin used for forming the first insulation layer 32. The thickness of the second insulation layer 34 is, for example, approximately 15-35 μm. The second insulation layer 34 may include a filler such as silica ($SiO_2$).

Then, the third wiring layer 35, which is to be connected to the second wiring layer 33 via the third via hole 34x, is formed on the second insulation layer 34. The third wiring layer 35 includes a via wiring filling the inside of the third via hole 34x and a wiring pattern formed on the second insulation layer 34. The third wiring layer 35 is to be electrically connected to the part of the second wiring layer 33 exposed at a bottom part of the third via hole 34x. For example, copper (Cu) may be used as the material of the third wiring layer 35. The third wiring layer 35 is formed by, for example, a semi-additive method.

The thickness of the wiring pattern included in the third wiring layer 35 may be, for example, approximately 10-20 μm.

Figure 12:
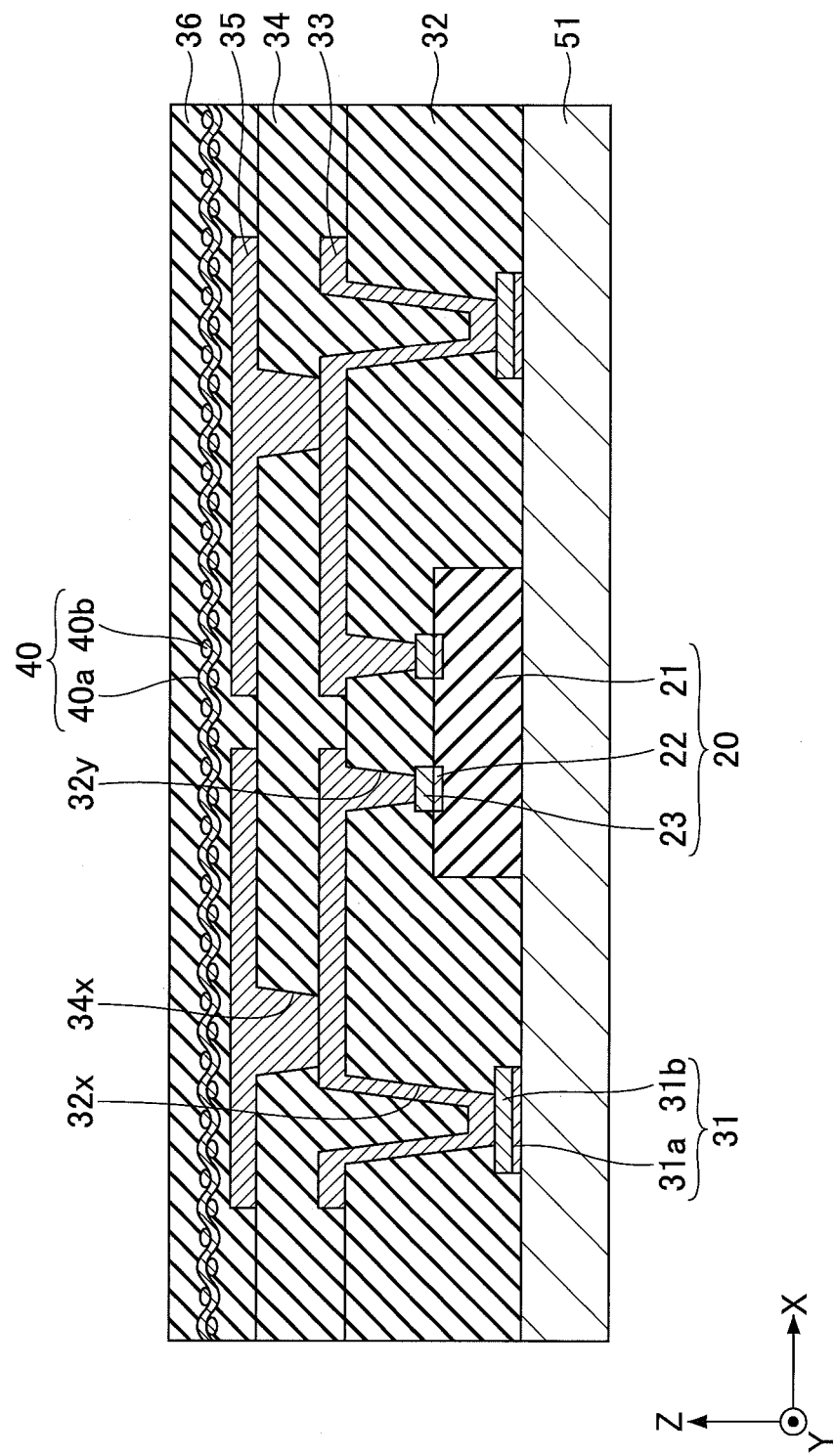

Then, in the step illustrated in FIG. 12, the third insulation layer 36 is layered on the second insulation layer 34. The third insulation layer 36 has, for example, an insulating resin impregnated in the glass cloth 40. The main component of the insulating resin may be, for example, an epoxy resin. The thickness of the third insulation layer 36 is, for example, approximately 50-70 μm. The third insulation layer 36 may include a filler such as silica ($SiO_2$). In forming the third insulation layer 36, a resin film (prepreg) that has an insulating resin (e.g., an insulating resin having an epoxy resin as a main component) impregnated in the glass cloth 40 is prepared. Then, the resin film, which covers the third wiring layer 35, is layered on the second insulation layer 34 and cured by being applied with pressure or heat. In curing the resin film of the third insulation layer 36, the formation of voids can be prevented by applying heat or pressure to the resin film inside a vacuum atmosphere.

Figure 13:
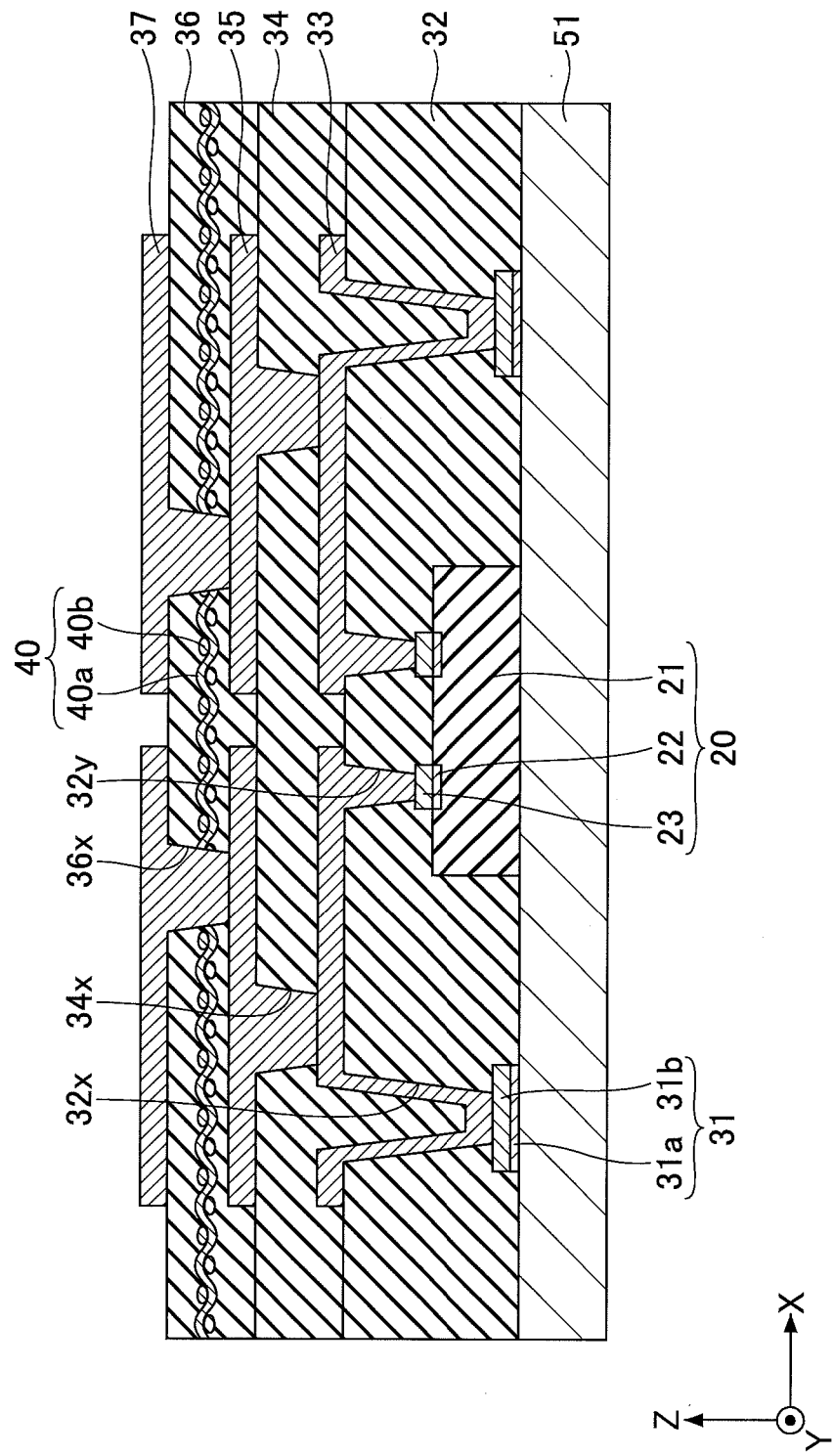

Then, in the step illustrated in FIG. 13, the fourth wiring layer 37 is layered on the third insulation layer 36. That is, first, the fourth via hole 36x, which penetrates the third insulation layer 36 and exposes the top surface of the third wiring layer 35, is formed in the third insulation layer 36. Then, the fourth wiring layer 37, which is to be connected to the third wiring layer 35, is formed on the third insulation layer 36 via the fourth via hole 36x. The fourth wiring layer 37 includes a via wiring filling the inside of the fourth via hole 36x and a wiring pattern formed on the third insulation layer 36. The fourth wiring layer 37 is to be electrically connected to the part of the third wiring layer 35 exposed at a bottom part of the fourth via hole 36x. For example, the material of the fourth wiring layer 37 may be copper (Cu). The fourth wiring layer 37 may be formed by, for example, a semi-additive method. The thickness of the wiring pattern included in the fourth wiring layer 37 is, for example, approximately 10-20 μm.

Thereby, a predetermined build-up wiring layer is formed on one side of the substrate 51. Although the build-up layer in this embodiment is formed having three layers (second wiring layer 33, third wiring layer 35, and fourth wiring layer 37), the build-up layer may be formed having n layers (n being an integer equal to or greater than 1).

Figure 14:
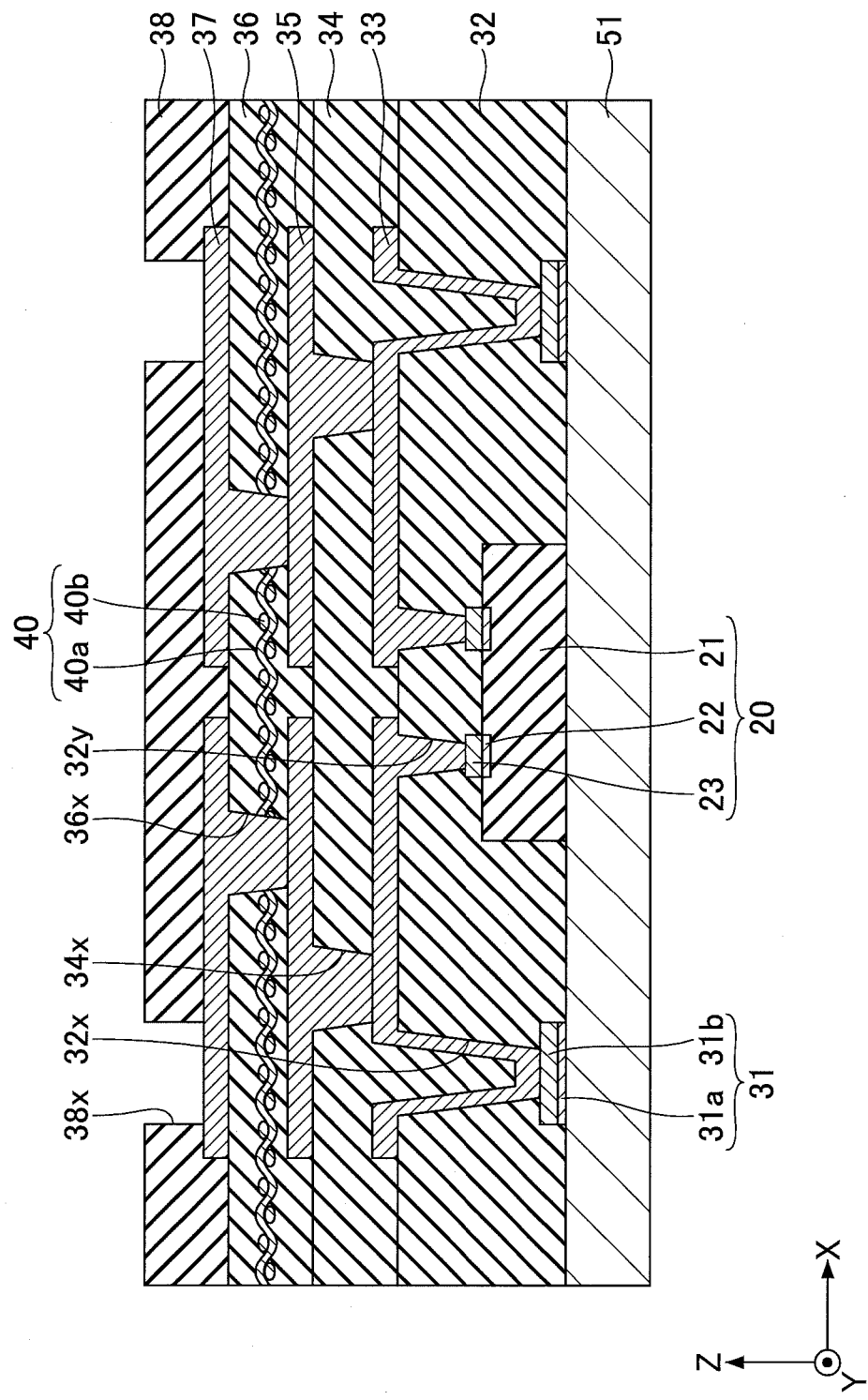

Then, in the step illustrated in FIG. 14, the solder resist layer 38 including the opening 38x exposed at a part of the fourth wiring layer 37 is formed on the third insulation layer 36. The solder resist layer 38 covering the fourth wiring layer 37 is formed on the third insulation layer 36. The solder resist layer 38 is formed, for example, by applying a liquid-like or a paste-like insulating resin on the third insulation layer 36. The liquid-like or paste-like insulating resin may be, for example, an epoxy or an acrylic photosensitive insulating resin. The insulating resin may be applied by using, for example, a screen-printing method, a roll-coating method, or a spin-coating method. Alternatively, a film-like insulating resin that covers the fourth wiring layer 37 may be laminated on the third insulating layer 36. Likewise, the film-like insulating resin may be, for example, an epoxy or an acrylic photosensitive insulating resin.

The opening 38x is formed by performing an exposing process and a developing process on the applied or laminated insulating resin (i.e. photolithography method). Alternatively, a film-like insulating resin, which is already formed with the opening 38x, may be laminated on the third insulating layer 36. It is to be noted that a non-photosensitive insulating resin may be used as the material of the solder resist layer 38. In this case of using the non-photosensitive resin, the opening 38x is formed, for example, by a laser processing method using a $CO_2$ laser or a blasting process using an abrasive (e.g., alumina abrasive) after forming the solder resist layer 38 on the third insulation layer 36 and curing the solder resist layer 38.

By performing the step illustrated in FIG. 14, the solder resist layer 38 having the opening 38x is formed, and a part of the fourth wiring layer 37 is exposed in the opening 38x. According to necessity, a metal layer may be formed on a part of the fourth wiring layer 37 exposed at a bottom part of the opening 38x. The metal layer may be formed by, for example, an electroless plating method. The metal layer may be, for example, a Au layer, a Ni/Au (a metal layer including a Ni layer and a Au layer layered in this order), or a Ni/Pd/Au layer (a metal layer including a Ni layer, a Pd layer, and a Au layer layered in this order).

Figure 15:
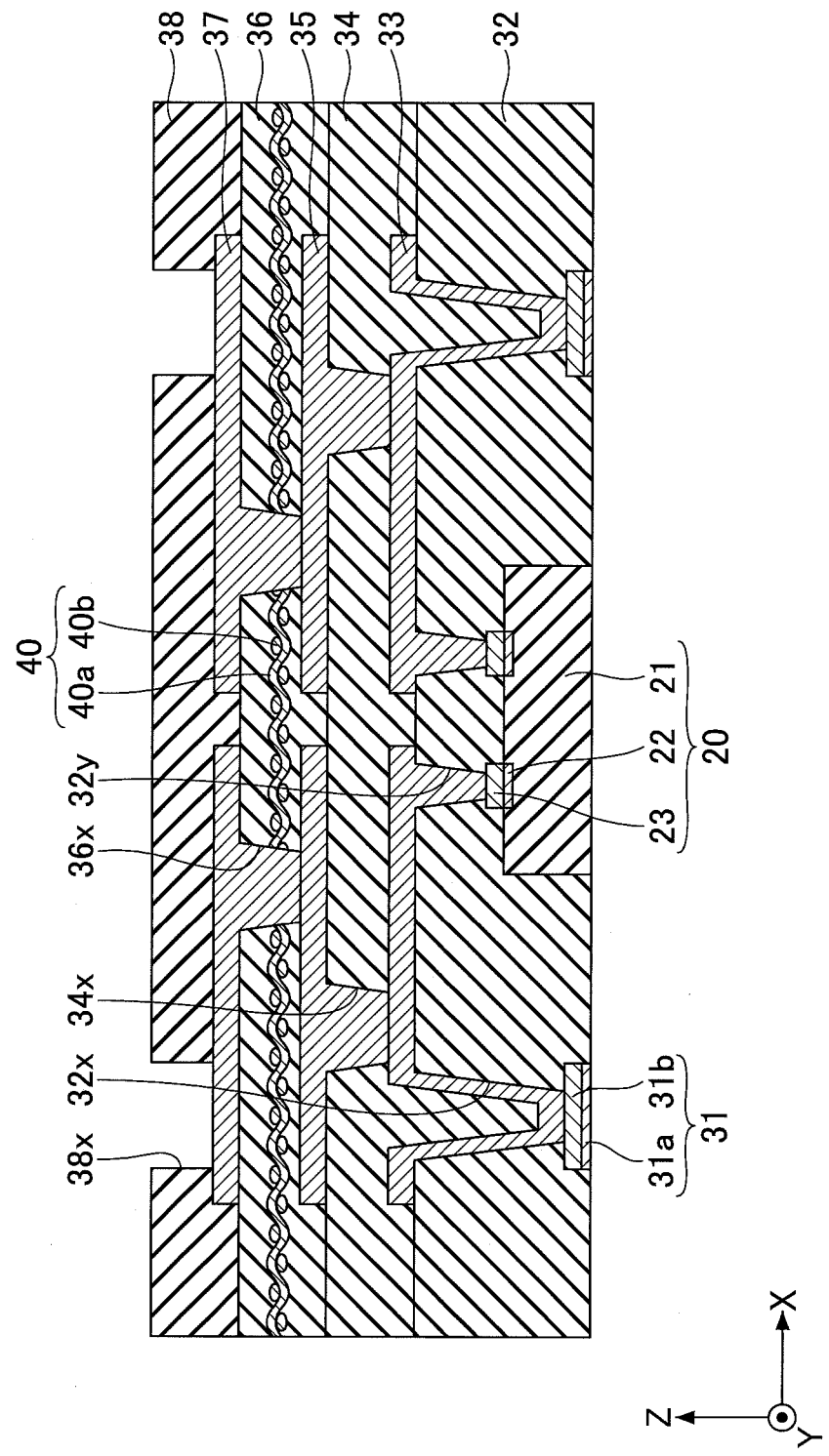

Then, in the step illustrated in FIG. 15, the substrate 51 illustrated in FIG. 14 is removed. The substrate 51 being formed of copper foil may be removed by, for example, a wet-etching method in which a ferric chloride solution, a cupric chloride solution, an ammonium persulfate solution, a copper ammonium chloride solution, a mixture of sulfuric acid and hydrogen peroxide is used. In the case where the metal layer is formed, the substrate 51 formed of copper foil can be selectively etched because the gold (Au) layer, for example, is the outermost layer of the first wiring layer 31 exposed at the first insulation layer 32, and the rear surface of the semiconductor chip 20 exposed at the first insulation layer 32 is formed of silicon. However, in a case where the fourth wiring layer 37 is formed of copper (Cu), it is necessary to mask the fourth wiring layer 37 for preventing the part of the fourth wiring layer 37 exposed at the bottom part of the opening 38x from being etched along with the substrate 51.

Figure 16:
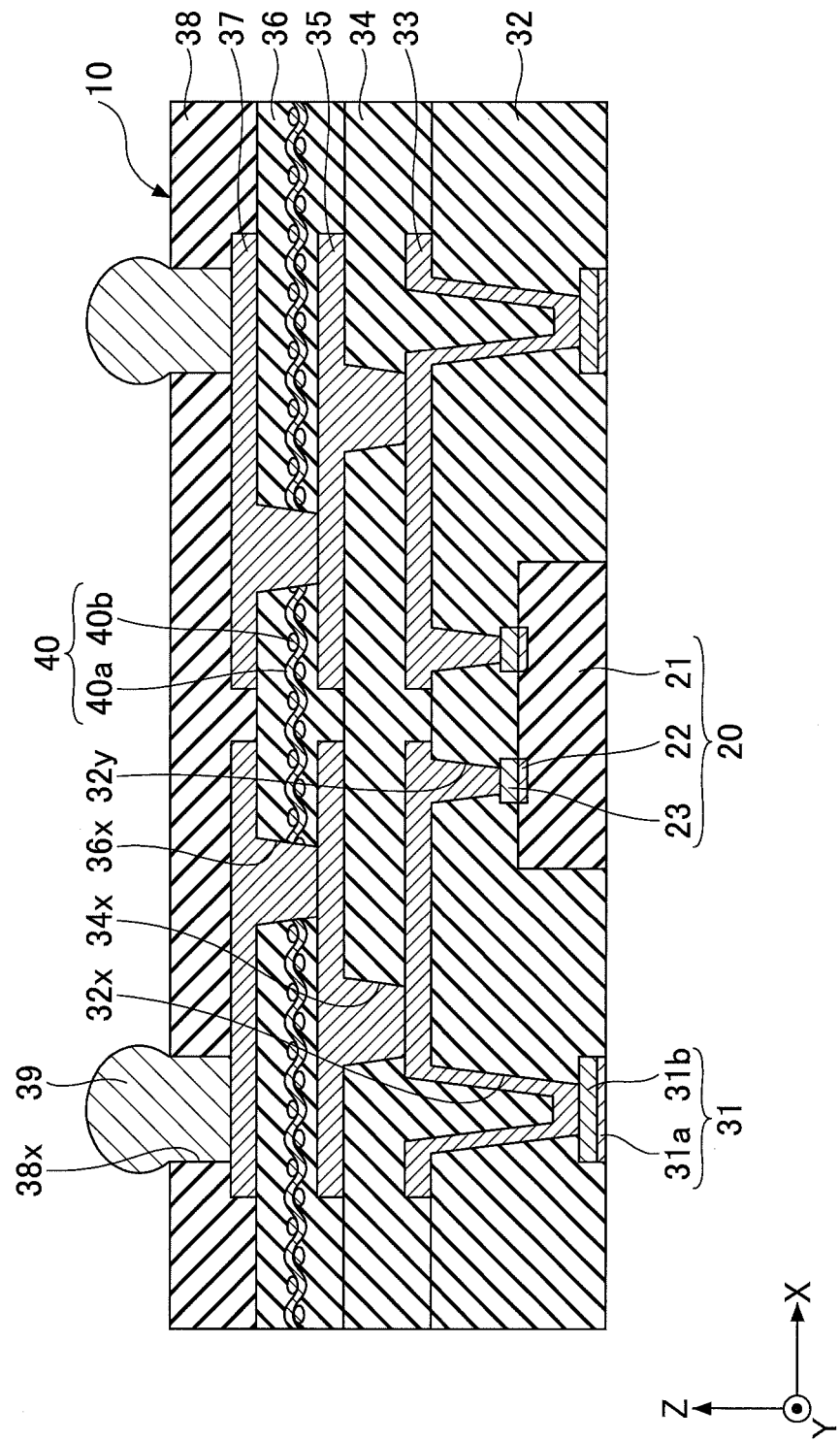

Then, in the step illustrated in FIG. 16, the external connection terminal 39 is formed on the part of the fourth wiring layer 37 exposed at the bottom part of the opening 38x (on the metal layer in the case where the metal layer is formed on the fourth wiring layer 37). The external connection terminal 39 functions as a terminal to be electrically connected to, for example, a pad of a mount board (e.g., motherboard) or a pad of another semiconductor package (not illustrated). For example, a solder ball may be used as the external connection terminal 39. For example, an alloy including Pb, an alloy including Sn and Cu, an alloy including Sn and Sb, an alloy including Sn and Ag, or an alloy including Sn, Ag, and Cu may be used as the material of the solder ball.

As an example of forming the external connection terminal 39, first, flux is applied as a surface treatment agent on the part of the fourth wiring layer 37 exposed at the bottom part of the opening 38x. Then, a solder ball is mounted on the part of the fourth wiring layer 37 exposed at the bottom part of the opening 38x. Then, a reflow process is performed on the solder ball mounted on the part of the fourth wiring layer 37 exposed at the bottom part of the opening 38x in a temperature of approximately 240-260° C. Then, by washing away the flux, the external connection terminal 39 is obtained. Alternatively, a lead pin may be used as the external connection terminal 39.

Although the external connection terminal 39 is formed in the part of the fourth wiring layer 37 exposed at the bottom part of the opening 38x in the above-described embodiment, the external connection terminal 39 does not always need to be formed. In a case of not forming the external connection terminal 39, the part of the fourth wiring layer 37 itself exposed at the bottom part of the opening 38x is used as an external connection terminal. In a case of not forming the external connection terminal 39 where a metal layer is formed on the part of the fourth wiring layer 37 exposed at the bottom part of the opening 38x, the metal layer itself is used as an external connection terminal. Thus, the part of the fourth wiring layer 37 needs only to be exposed at the solder resist layer 38 to allow the external connection terminal 39 to be formed according to necessity.

Although a single semiconductor package 10 is fabricated on the substrate 51 in the above-described steps of FIGS. 3-16, plural semiconductor packages 10 may be fabricated on the substrate 51. In the case of fabricating plural semiconductor packages 10, the plural semiconductor packages 10 may be obtained by forming plural members (which are to be fabricated into the plural semiconductor packages 10) on the substrate 51, removing the substrate 51, forming the external connection terminals 39 on the plural members, and dicing the plural members into independent members (semiconductor packages 10). Alternatively, in dicing the plural members, plural semiconductor chips 20 may be included in a single independent member. By dicing the plural members into independent members, a semiconductor package including plural semiconductor chips 20 can be fabricated.

[Example of Mounting Semiconductor Package According to the First Embodiment of the Present Invention]

Figure 17:
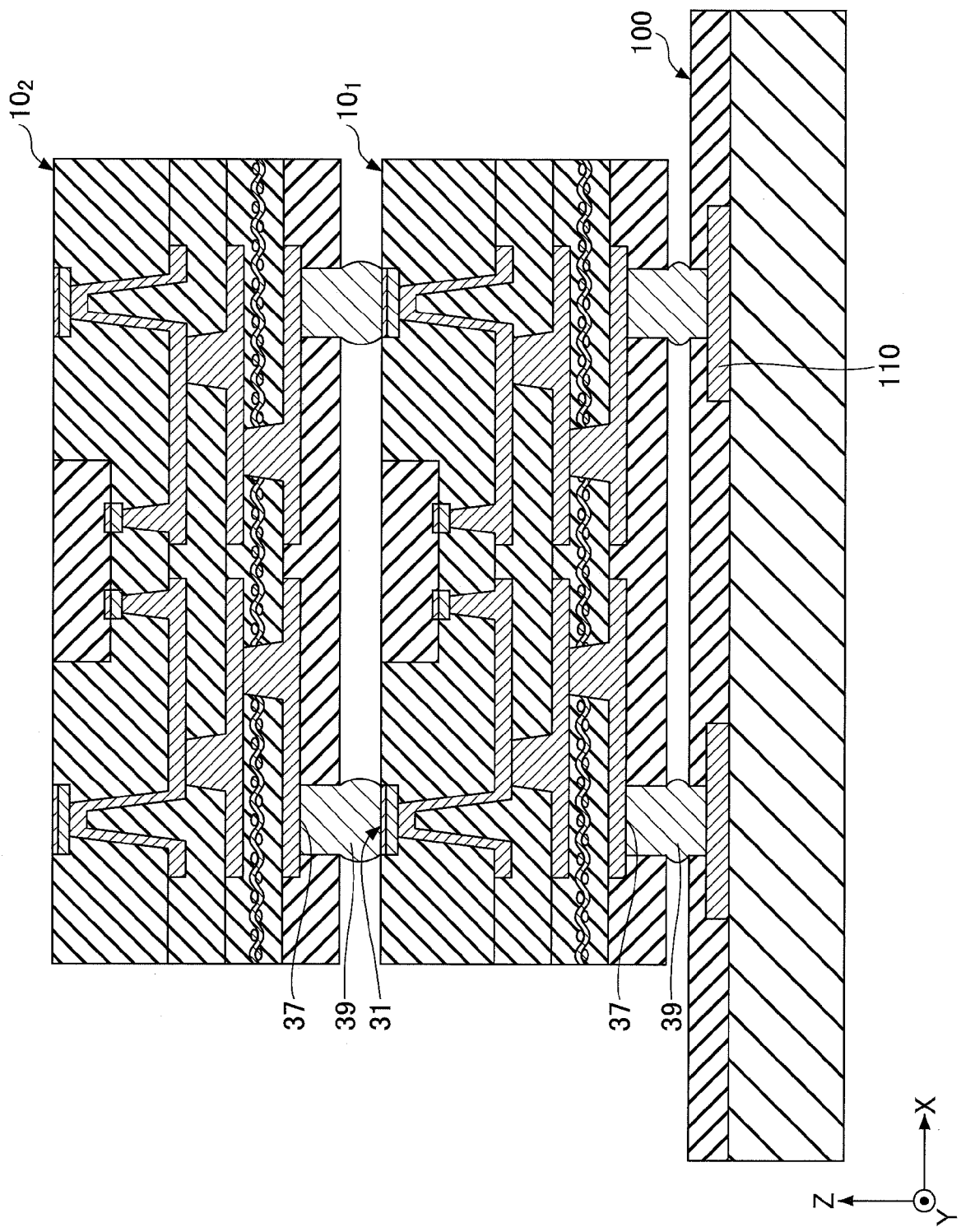
FIG. 17 is a cross-sectional view illustrating an example of mounting the semiconductor package according to the first embodiment.

Next, an example of mounting a semiconductor package according to the first embodiment of the present invention is described. FIG. 17 is a cross-sectional view illustrating an example of mounting the semiconductor package according to the first embodiment. With reference to FIG. 17, a semiconductor package $10_1$ is mounted on a motherboard 100, and another semiconductor package $10_2$ is further mounted on the semiconductor package $10_1$. It is to be noted that different reference numerals are assigned to the semiconductor package $10_1$ and the semiconductor package $10_2$ in FIG. 17 merely for the sake of convenience. Both the semiconductor package $10_1$ and the semiconductor package $10_2$ have substantially the same configuration as the configuration of the above-described semiconductor package 10 (see, for example, FIG. 1). Further, the semiconductor packages $10_1$ and $10_2$ of FIG. 17 are illustrated in a vertically inverted state compared to the semiconductor package 10 illustrated in FIG. 1.

In FIG. 17, an electrode pad 110 of the motherboard 100 and the second electrode pad 37 of the semiconductor package $10_1$ are electrically connected to each other via the external connection terminal 39 of the semiconductor package $10_1$. Further, the first electrode pad 31 of the semiconductor package $10_1$ and the second electrode pad 37 of the semiconductor package $10_2$ are electrically connected to each other via the external connection terminal 39 of the semiconductor package $10_2$.

Thereby, the semiconductor packages $10_1$ and $10_2$ can be layered on the motherboard 100. It is to be noted that 3 or more semiconductor packages 10 may be layered on the motherboard 100. Further, another semiconductor package, a semiconductor chip, or an electronic device (e.g., resistor, condenser) may be mounted on the semiconductor package $10_1$ instead of the semiconductor package $10_2$ or in addition to the semiconductor package $10_2$.

With the semiconductor package 10 according to the first embodiment of the present invention, the third insulation layer 36 having the glass cloth 40 installed therein is provided on the other side of the semiconductor package 10 opposite of the side of the first insulation layer 32 having the semiconductor chip 20 installed therein. Accordingly, compared to a case where the third insulation layer 36 is only formed of an insulating resin, the values of the physical properties (e.g., thermal expansion coefficient, Young's modulus) on the other side of the semiconductor package 10 becomes closer to the values of the physical properties on the side of the first insulation layer 32 having the semiconductor chip 20 installed therein (i.e. the one side of the semiconductor package 10) by installing the glass cloth 40 in the third insulation layer 36 on the other side of the semiconductor package 10. Further, unlike the case where the third insulation layer 36 is only formed of an insulating resin, the third insulation layer 36 having the glass cloth 40 installed therein can maintain strength even in an atmosphere of approximately 260° C. As a result, the semiconductor package 10 can be prevented from being warped by, for example, thermal stress. Further, because the rigidity of the entire semiconductor package 10 can be improved, the semiconductor package 10 can maintain a consistent shape.

<First Modified Example of First Embodiment of Present Invention>

In the below-described first modified example of the first embodiment of the present invention, the glass cloth 40 is installed in a solder resist layer 48 which is the farthest layer from the first insulation layer 32 (sealing insulation layer). In the first modified example of the first embodiment of the present invention, like components/parts are denoted by like reference numerals as those of the above-described first embodiment of the present invention and are not further explained.

Figure 18:
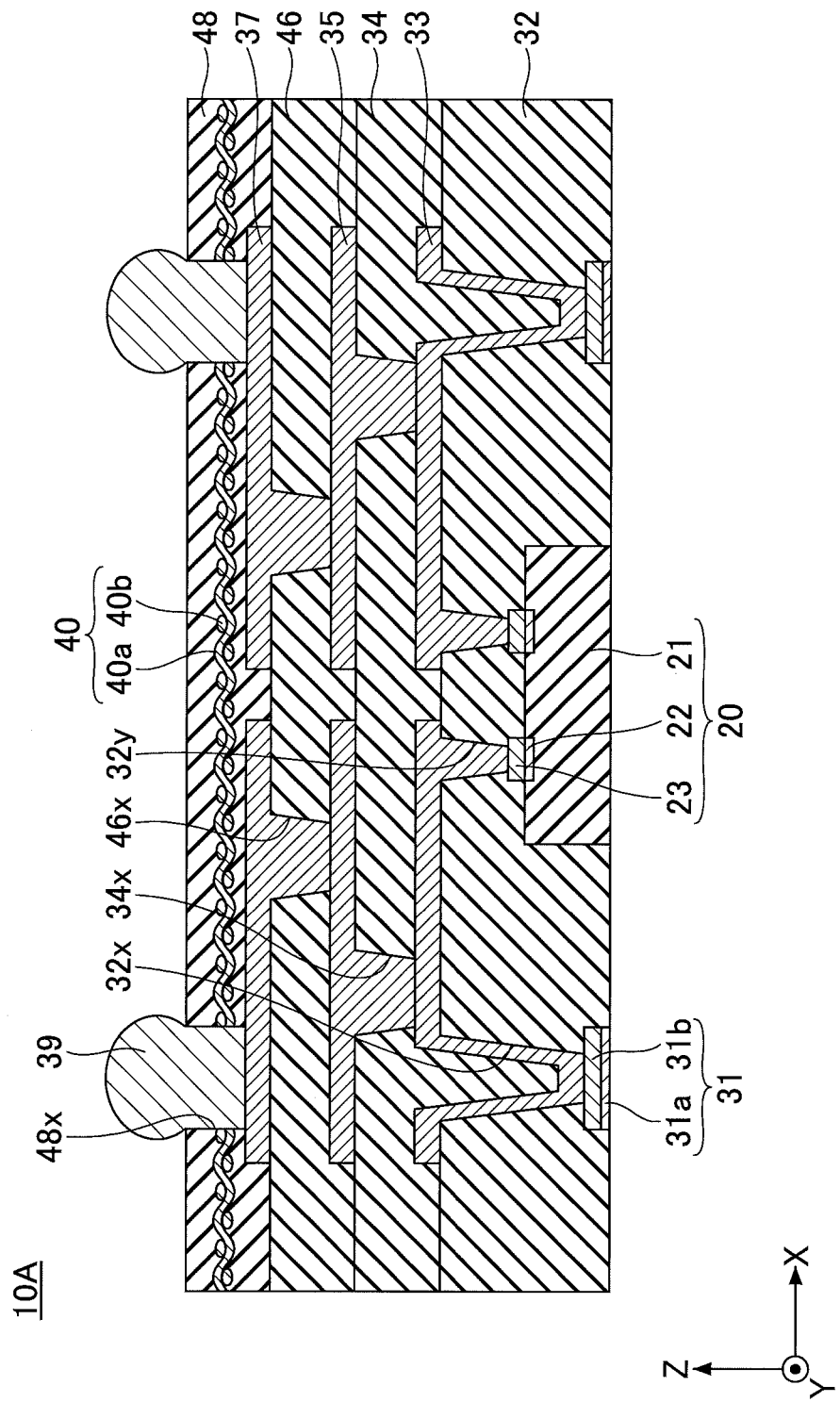
FIG. 18 is a cross-sectional view illustrating a semiconductor package according to a first modified example of the first embodiment of the present invention.

FIG. 18 is a cross-sectional view illustrating a semiconductor package 10A according to the first modified example of the first embodiment of the present invention. With reference to FIG. 18, the semiconductor package 10A is different from the semiconductor package 10 (see, for example, FIG. 1) in that the third insulation layer 36 is replaced with a third insulation layer 46, and the solder resist layer 38 is replaced with a solder resist layer 48.

Unlike the third insulation layer 36, the third insulation layer 46 has no glass cloth 40 installed therein. For example, a thermosetting insulating resin having an epoxy resin or a phenol resin as a main component may be used as the material of the third insulation layer 46. The thickness of the third insulation layer 46 may be, for example, approximately 15-35 μm. The third insulation layer 46 may contain a filler such as silica ($SiO_2$).

Unlike the solder resist layer 38, the solder resist layer 48 has the glass cloth 40 installed therein. More specifically, the solder resist layer 48 is a layer that has, for example, an insulating resin impregnated in the glass cloth 40. The insulating resin of the solder resist layer 48 may include, for example, an epoxy resin as a main component. The thickness of the solder resist layer may be, for example, approximately 50-70 μm. The solder resist layer 48 may include a filler such as silica ($SiO_2$).

The semiconductor package 10A can be manufactured substantially with the same steps for manufacturing the semiconductor package 10. However, unlike the manufacturing steps of the semiconductor package 10, the third insulation layer 46 having no glass cloth 40 installed therein is formed in the step illustrated in FIG. 12. Unlike the manufacturing steps of the semiconductor package 10, the solder resist layer 48 having the glass cloth 40 installed therein is formed in the step illustrated in FIG. 14. It is to be noted that, although the insulating resin of the solder resist layer 48 can be removed in a case where a photolithography method is used for forming the opening 48x, the glass cloth 40 of the solder resist layer 48 cannot be removed.

Figure 19:
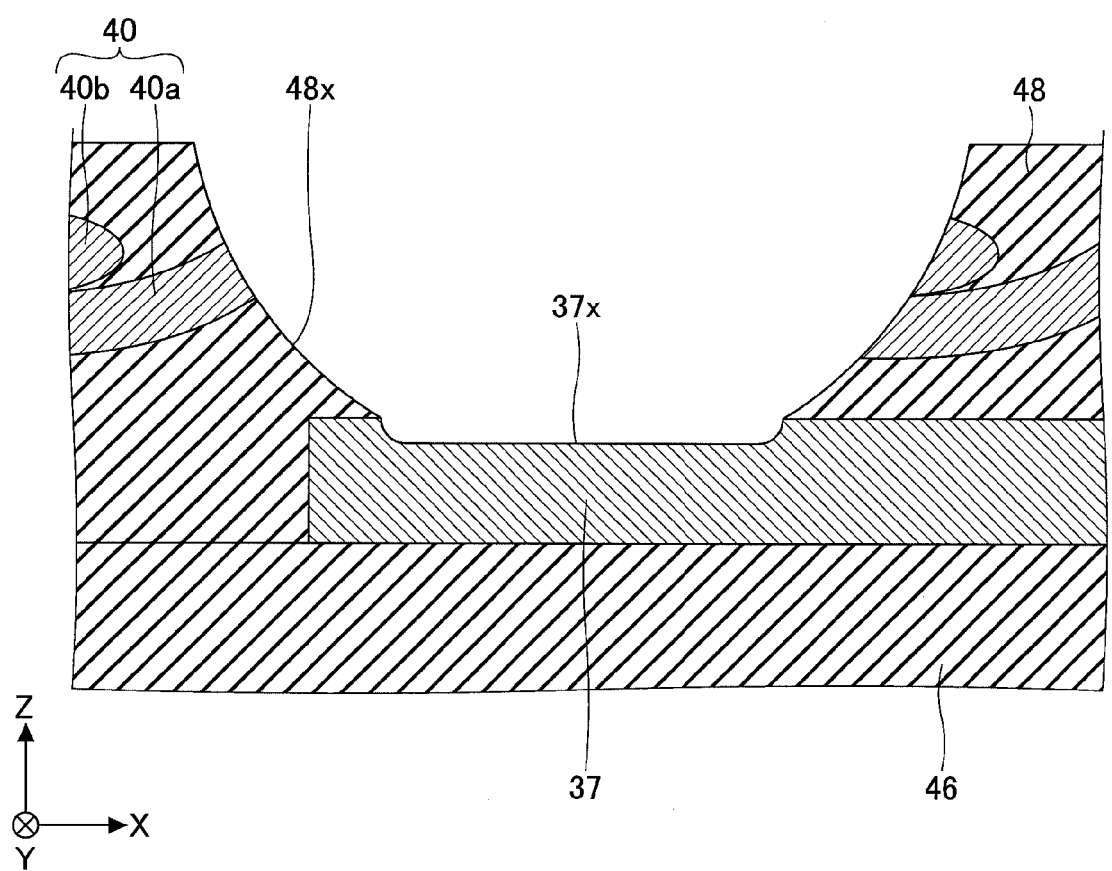
FIG. 19 is an enlarged cross-sectional view illustrating the vicinity of an opening of FIG. 18.

Therefore, in order to remove both the insulating resin and the glass cloth 40 of the solder resist layer 48, it is necessary to form the opening 48x, for example, by a laser processing method using $CO_2$ or a blasting process using an abrasive (e.g., wet-blast process using an alumina abrasive). It is, however to be noted that the blasting process is preferred compared to the laser processing method for forming the opening 48x. The reason that the blasting process is preferred is described with reference to FIG. 19. FIG. 19 is an enlarged cross-sectional view illustrating the vicinity of the opening 48x of FIG. 18. FIG. 19 illustrates a case where the opening 48x is formed by the blasting process. It is to be noted that the external connection terminal 39 is omitted in FIG. 19.

In a case where the opening 48x is formed in the solder resist layer 48 by the laser processing method, the cross-section of the sidewall of the opening 48x becomes a straight tapered shape (not illustrated). On the other hand, in a case where the opening 48x is formed in the solder resist layer 48 by the blasting process (e.g., wet-blast process), the cross-section of the sidewall of the opening 48x becomes a recessed round (R) shape as illustrated in FIG. 19. Accordingly, in a case of mounting a solder ball on the second electrode pad 37 exposed at the inside of the opening, it becomes easy to mount the solder ball because a spherical solder ball is dropped along the recessed round shape sidewall of the opening 48x.

Further, in a case where the opening 48x is formed by the laser process method, the difference between the etching rate with respect to the insulating resin of the solder resist layer 48 and the etching rate with respect to the glass cloth of the solder resist causes an end part of the glass cloth 40 to protrude from the sidewall of the opening 48x. On the other hand, in a case where the opening 48x is formed by the blasting process (e.g., wet-blast process), an end part of the glass cloth does not protrude from the sidewall of the opening 48x because the end part of the glass cloth 40 is polished with an abrasive. As a result, in a case of forming the external connection terminal 39 such as a solder ball), the solder ball can be easily mounted to the opening 48x without having the solder ball caught by a protruding part of the glass cloth 40. Further, plating can be easily performed on a part of the fourth wiring layer 37 (second electrode pad 37) exposed in the opening 48x.

Further, in a case of forming the opening 48x in the solder resist layer 48 by the blasting process (wet-blast process), it is preferable to form a recess part 37x in the part of the fourth wiring layer 37 (uppermost layer among the wiring layers of the semiconductor package 10A) exposed at the opening 48x in addition to forming the opening 48x having a sidewall with a recessed round-shaped cross section. By forming the recess part 37x, there is no need to perform a desmear process on the inside of the opening 48x after forming the opening 48x.

Accordingly, even in a case where the glass cloth 40 is installed in the solder resist layer 48 and not in the third insulation layer 46, the same effect (advantage) can be attained as that of the above-described first embodiment of the present invention.

As long as the glass cloth 40 is provided on the other side of the first insulation layer 32 having the semiconductor chip 20 installed therein, the glass cloth 40 may be installed in an insulation layer (solder resist layer) farthest from the first insulation layer 32 or in an insulation layer (third insulation layer) adjacent to the insulation layer (solder resist layer) farthest from the first insulation layer 32. Further, the glass cloth 40 may be installed in another insulation layer as long as the glass cloth 40 is provided on the other side of the first insulation layer 32 having the semiconductor chip 20 installed therein. It is to be noted that, an effect such as reduction of warping decreases in a case where the glass cloth 40 is installed only in the insulation layer situated near the first insulation layer 32.

Further, in a case of forming the opening 48x in the solder resist layer 48 by the blasting process (wet-blast process), the end part of the glass cloth 40 does not protrude from the sidewall of the opening 48x. Thereby, plating can be easily performed on a part of the fourth wiring layer 37 (second electrode pad 37) exposed in the opening 48x, and a connector pin or the external connection terminal 39 (e.g., solder ball, lead pin) can be easily positioned in the opening 48x.

<Second Modified Example of First Embodiment of Present Invention>

In the below-described second modified example of the first embodiment of the present invention, the first electrode pad 31 is not formed. In the second modified example of the first embodiment of the present invention, like components/parts are denoted by like reference numerals as those of the above-described first embodiment of the present invention and are not further explained.

Figure 20:
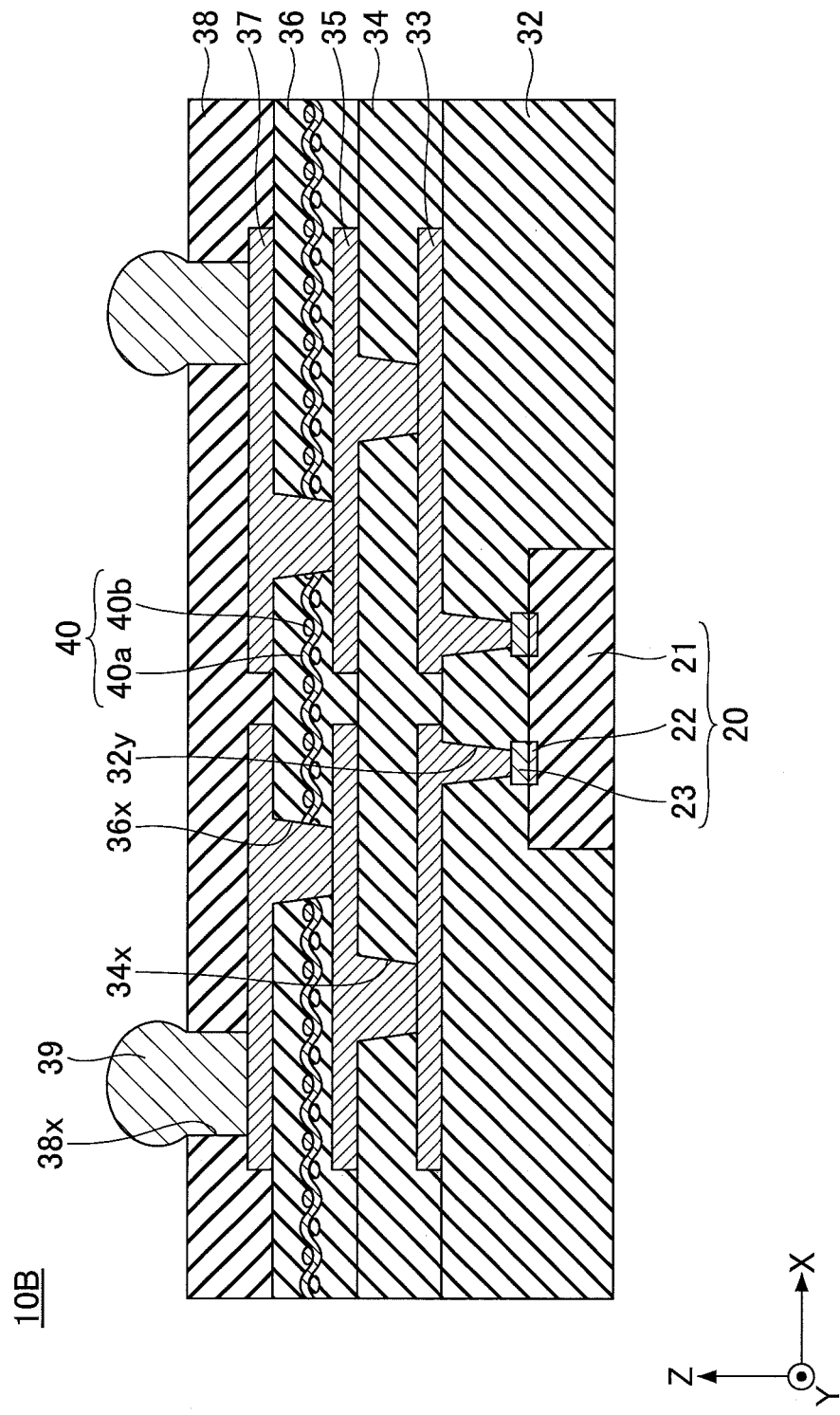
FIG. 20 is a cross-sectional view illustrating a semiconductor package according to a second modified example of the first embodiment of the present invention.

FIG. 20 is a cross-sectional view illustrating a semiconductor package 10B according to the second modified example of the first embodiment of the present invention. With reference to FIG. 20, the semiconductor package 10B is different from the semiconductor package 10 (see, for example, FIG. 1) in that neither the first wiring layer 31 (first electrode pad 31) nor the first via hole 32x are formed in the semiconductor package 10B. The semiconductor package 10B can be manufactured substantially with the same steps for manufacturing the semiconductor package 10. However, unlike the manufacturing steps of the semiconductor package 10, there is no step for forming the first wiring layer 31 (first electrode pad 31) or the first via hole 32x. Accordingly, an electrode pad is to be formed at least on one side of the semiconductor package 10B.

Figure 21:
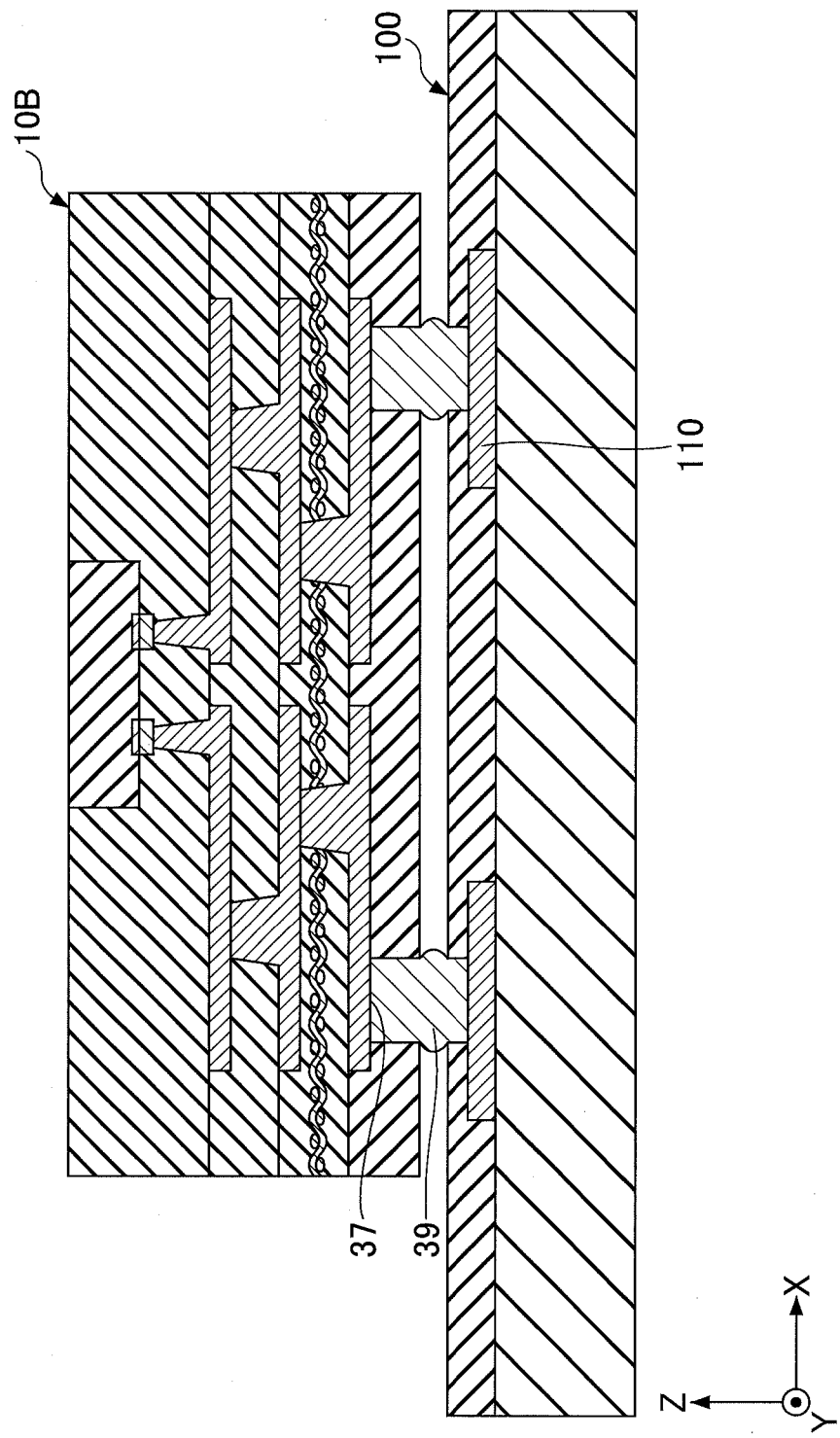
FIG. 21 is a cross-sectional view illustrating an example of mounting a semiconductor package according to the second modified example of the first embodiment of the present invention.

FIG. 21 is a cross-sectional view illustrating an example of mounting the semiconductor package 10B according to the second modified example of the first embodiment of the present invention. With reference to FIG. 21, the semiconductor package 10B is mounted on the motherboard 100. More specifically, the electrode pad 110 of the motherboard 100 and the second electrode pad 37 of the semiconductor package 10B are electrically connected to each other via the external connection terminal 39 of the semiconductor package 10B. It is to be noted that the semiconductor package 10B is illustrated in a vertically inverted state compared to the semiconductor package 10B illustrated in FIG. 20.

Accordingly, in a case where plural semiconductor packages are not required to be layered on the motherboard 100, the semiconductor package 10B may have an electrode pad provided only on one side of the semiconductor package 10B.

<Third Modified Example of First Embodiment of Present Invention>

In the below-described third modified example of the first embodiment of the present invention, the first electrode pad 31 is provided in a position recessed with respect to the bottom surface of the first insulation layer 32. In the third modified example of the first embodiment of the present invention, like components/parts are denoted by like reference numerals as those of the above-described first embodiment of the present invention and are not further explained.

Figure 22:
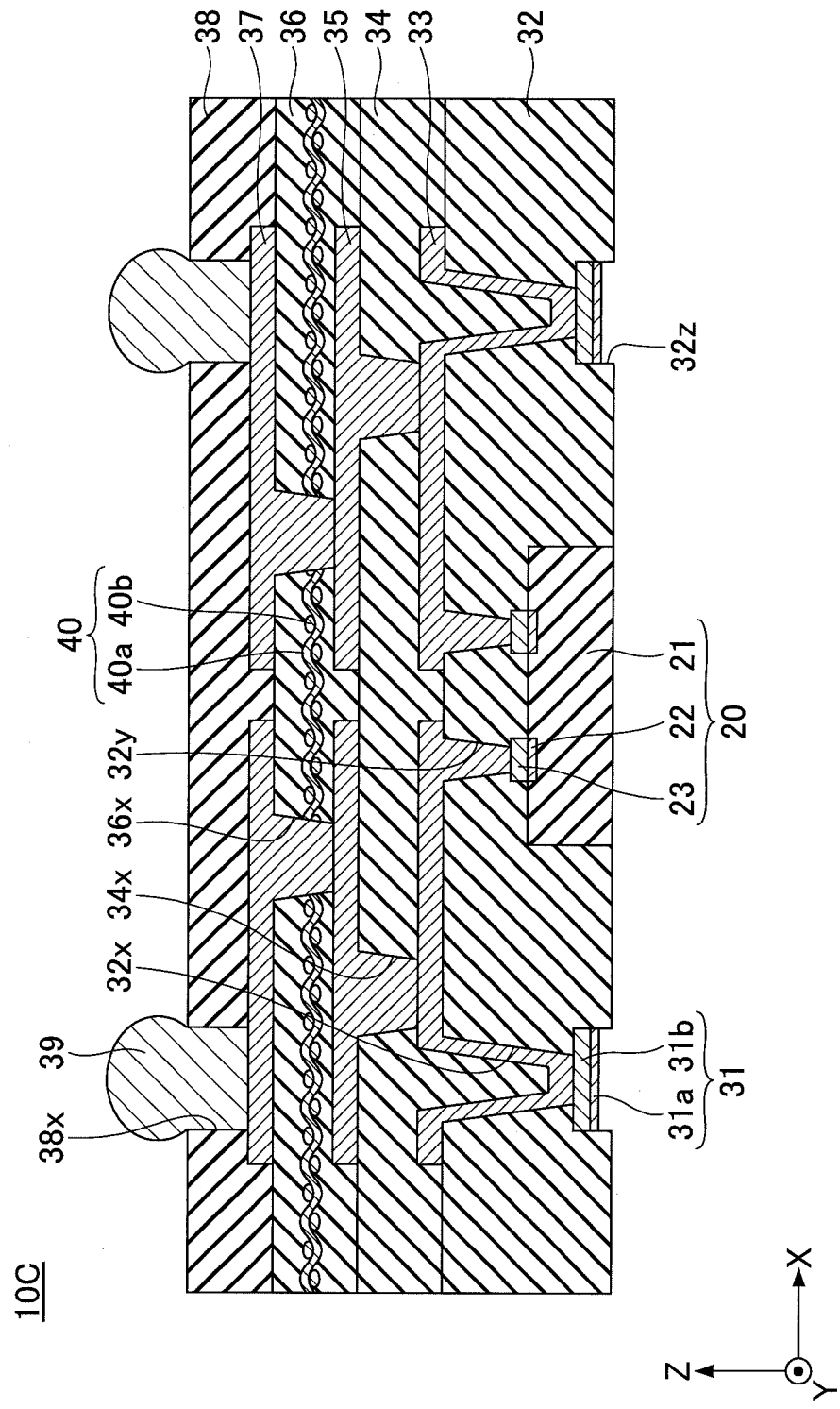
FIG. 22 is a cross-sectional view illustrating a semiconductor package according to a third modified example of the first embodiment of the present invention.

FIG. 22 is a cross-sectional view illustrating a semiconductor package 10C according to the third modified example of the first embodiment of the present invention. With reference to FIG. 22, the semiconductor package 100 is different from the semiconductor package 10 (see, for example, FIG. 1) in that the first wiring layer (first electrode pad 31) is provided in a position recessed with respect to the bottom surface of the first insulation layer 32 (i.e. a recess part 32z is formed in the first insulation layer 32).

Figure 23:
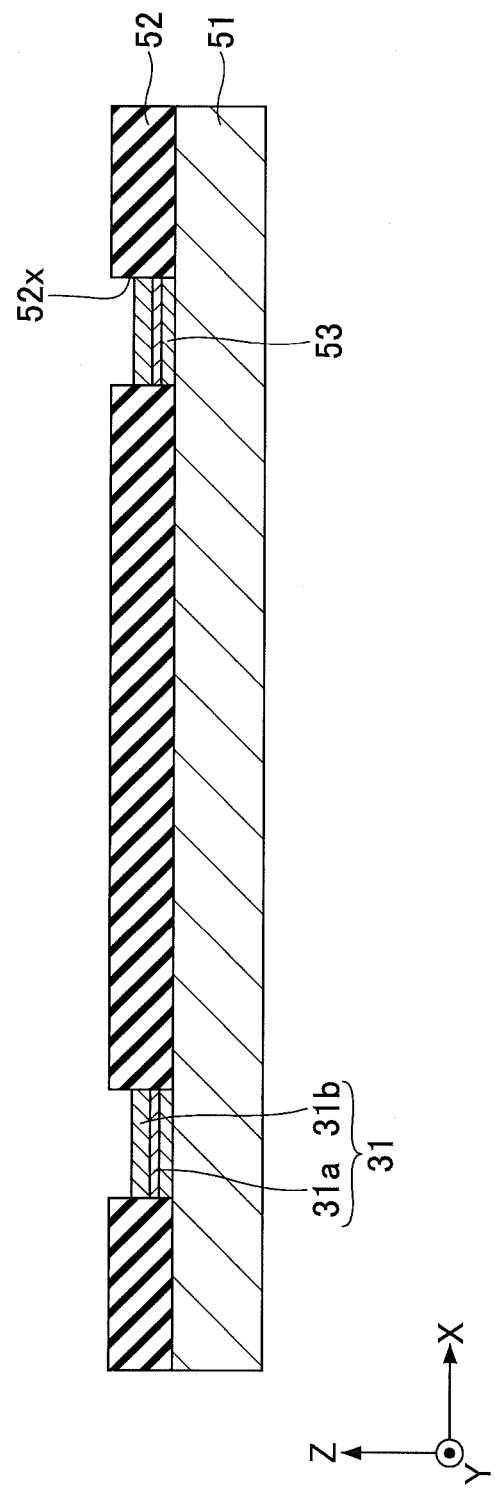
FIGS. 23-25 are schematic diagrams illustrating steps of a method for manufacturing the semiconductor package according to the third modified example of the first embodiment of the present invention.

The semiconductor package 100 is manufactured according to the following steps. First, the steps illustrated in FIGS. 3 and 4 of the first embodiment of the present invention are performed. Then, in the step illustrated in FIG. 23, a sacrifice layer 53 is formed in an opening 52x on one side of the substrate 51. The sacrifice layer 53 may be formed by, for example, an electroplating method using the substrate 51 as the feeding layer. Then, similar to the step illustrated in FIG. 5, the first wiring layer 31 including the first and the second layers 31a, 31b is layered on the sacrifice layer 53.

Figure 25:
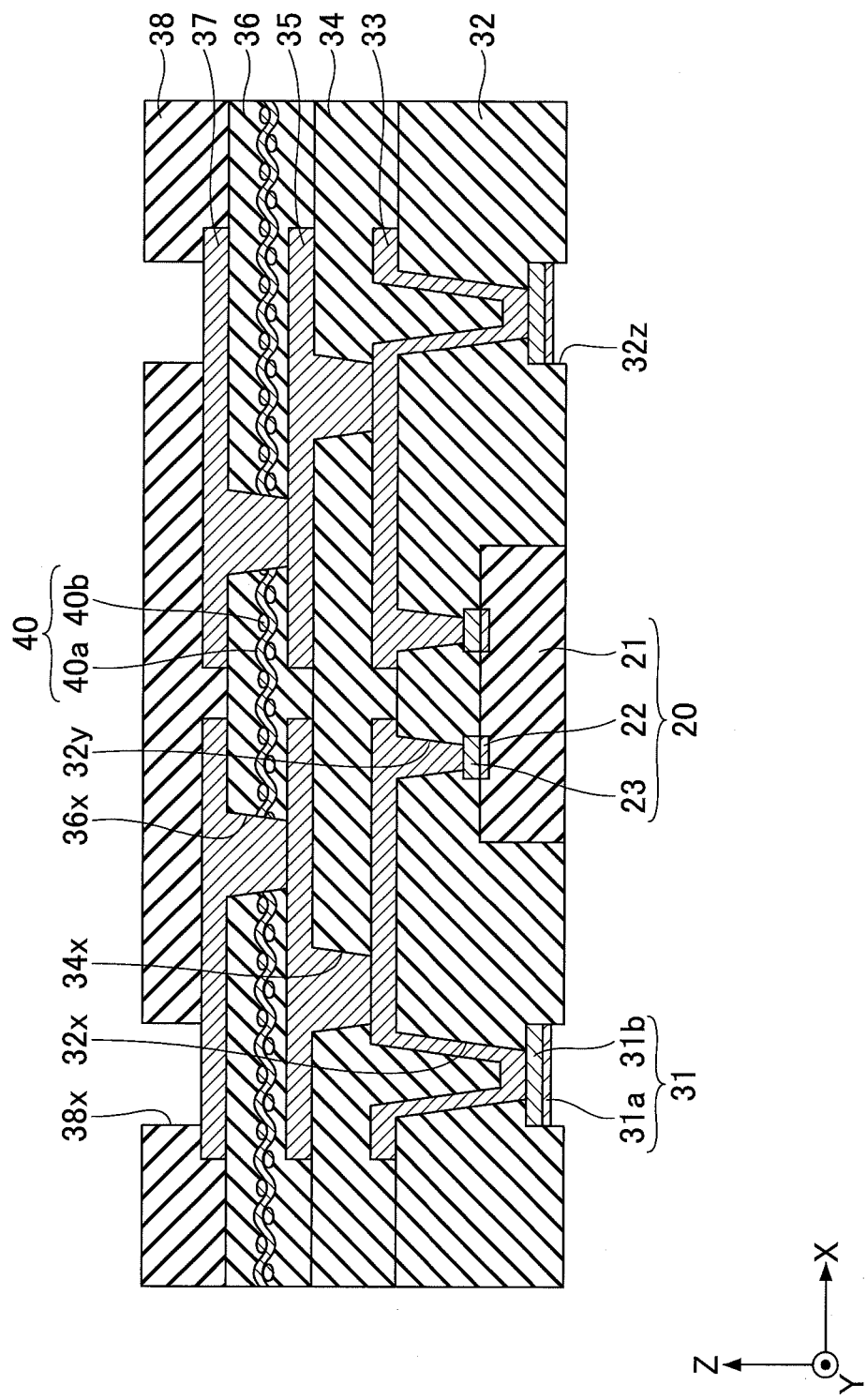

The sacrifice layer 53 is formed with the same material as the substrate 51 because the sacrifice layer 53 can be removed together with the substrate 51 by an etching process in the below-described step illustrated in FIG. 25. In this modified example, the material of the sacrifice layer 53 is copper (Cu) because copper foil is used as the substrate 51. The thickness of the sacrifice layer 53 is substantially equivalent to the depth in which the first electrode pad 31 is recessed with respect to the bottom surface of the first insulation layer 32 (i.e. depth of the recess part 32z). Therefore, although the thickness of the sacrifice layer 53 can be arbitrarily determined, the thickness of the sacrifice layer 53 is, for example, approximately 1-30 μm.

Figure 24:
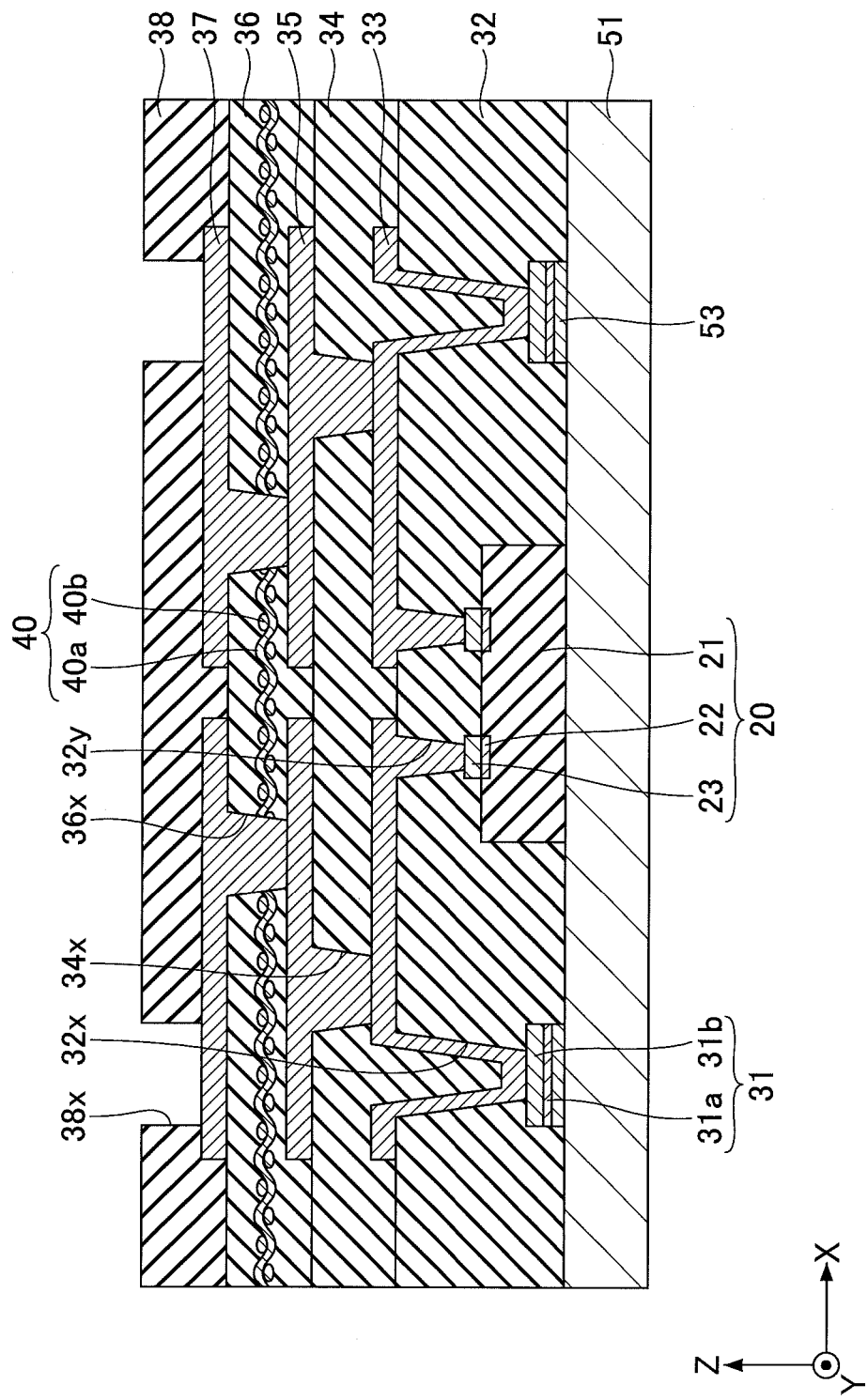

Then, by performing similar steps as those illustrated in FIGS. 6-14 of the first embodiment, a configuration illustrated in FIG. 24 is obtained. Then, in the step illustrated in FIG. 25, the substrate 51 and the sacrifice layer 53 illustrated in FIG. 24 are removed. The substrate 51 and the sacrifice layer 53, which are both formed of copper, are removed by, for example, a wet-etching method in which a ferric chloride solution, a cupric chloride solution, an ammonium persulfate solution, a copper ammonium chloride, or a mixture of sulfate acid and hydrogen is used.

In performing the wet-etching method, the substrate 51 and the sacrifice layer 53 (which are both formed of copper) can be selectively etched because the gold (Au) layer, for example, is the outermost layer of the first wiring layer 31 provided in a position recessed with respect to the bottom surface of the first insulation layer 32, and the rear surface of the semiconductor chip 20 exposed at the first insulation layer 32 is formed of silicon. Thereby, the recess part 32x is formed, so that the first wiring layer 31 is exposed at a position recessed with respect to the bottom surface of the first insulation layer 32. However, in a case where the fourth wiring layer 37 is formed of copper (Cu), it is necessary to mask the fourth wiring layer 37 for preventing the part of the fourth wiring layer 37 exposed at the bottom part of the opening 38x from being etched along with the substrate 51.

Then, by performing the similar step illustrated in FIG. 16 of the first embodiment of the present invention, the manufacturing of the semiconductor package 10C illustrated in FIG. 22 is completed.

Figure 26:
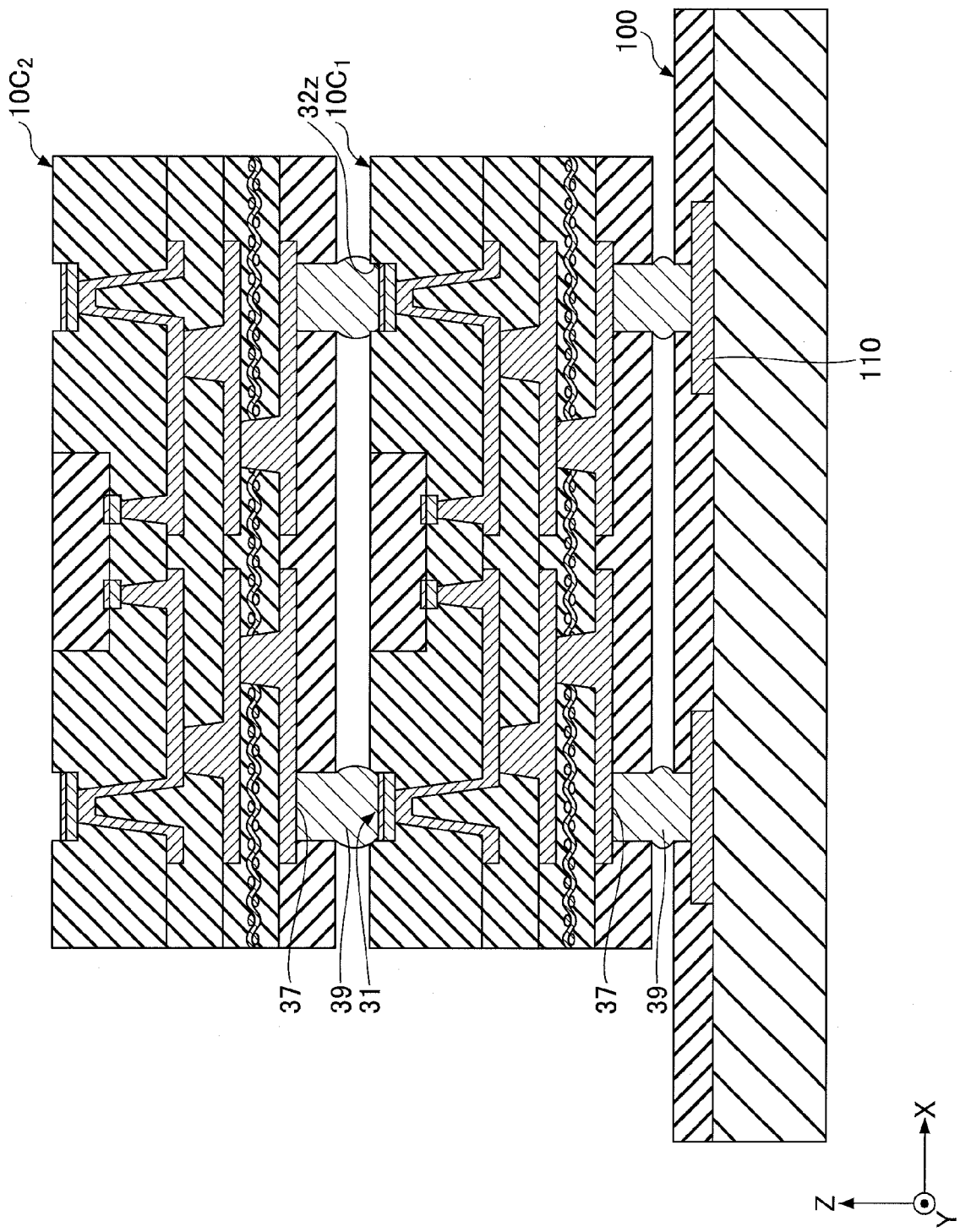
FIG. 26 is a cross-sectional view illustrating an example of mounting the semiconductor package according to the third modified example of the first embodiment of the present invention.

FIG. 26 is a cross-sectional view illustrating an example of mounting the semiconductor package 10C according to the third modified example of the first embodiment of the present invention. With reference to FIG. 26, a semiconductor package $10C_1$ is mounted on the motherboard 100, and another semiconductor package $10C_2$ is further mounted on the semiconductor package $10C_1$. It is to be noted that different reference numerals are assigned to the semiconductor package $10C_1$ and the semiconductor package $10C_2$ in FIG. 26 merely for the sake of convenience. Both the semiconductor package $10C_1$ and the semiconductor package $10C_2$ have substantially the same configuration as the configuration of the above-described semiconductor package 10C (see, for example, FIG. 22). Further, the semiconductor packages $10C_1$ and 10C$_2$ of FIG. 26 are illustrated in a vertically inverted state compared to the semiconductor package 10C illustrated in FIG. 22.

In FIG. 26, the electrode pad 110 of the motherboard 100 and the second electrode pad 37 of the semiconductor package 10C$_1$ are electrically connected to each other via the external connection terminal 39 of the semiconductor package 10C$_1$. Further, the first electrode pad 31 of the semiconductor package 10C$_1$ and the second electrode pad 37 of the semiconductor package 10C$_2$ are electrically connected to each other via the external connection terminal 39 of the semiconductor package 10C$_2$.

The semiconductor package 10C$_2$ can be easily positioned relative to the semiconductor package 10C$_1$ because the external connection terminal 39 of the semiconductor package 10C$_2$ can be inserted to the recess part 32z of the semiconductor package 10C$_1$ when the semiconductor package 10C$_2$ is mounted on the semiconductor package 10C$_1$.

Thereby, the semiconductor packages 10C$_1$ and 10C$_2$ can be layered on the motherboard 100. It is to be noted that 3 or more semiconductor packages 10C may be layered on the motherboard 100. Further, another semiconductor package, a semiconductor chip, or an electronic device (e.g., resistor, condenser) may be mounted on the semiconductor package 10C$_1$ instead of the semiconductor package 10C$_2$ or in addition to the semiconductor package 10C$_2$.

With the semiconductor package 100 according to the third modified example of the first embodiment of the present invention, the following effect (advantage) can be attained in addition to attaining the same effect (advantage) as that of the above-described first embodiment of the present invention. That is, with the semiconductor package 10C according to the third modified example of the first embodiment of the present invention, the semiconductor package(s) 10C can be easily positioned when layering the semiconductor package 10C by providing the first electrode pad 31 in a position recessed with respect to the bottom surface of the first insulation layer 32.

<Simulation of Warping>

A simulation of warping was performed on a semiconductor package having a total of seven wiring layers and seven insulation layers (including 1 solder resist layer). For the sake of convenience, the semiconductor package is referred to as "semiconductor package 10D". The semiconductor package 10D has 3 insulation layers and 3 wiring layers alternately inserted between the second wiring layer 33 and the second insulation layer 34 of FIG. 1.

The conditions of the simulation are that, the plane shape of the semiconductor package 10D is a rectangle having an area of 12 mm×12 mm, and the total thickness of the semiconductor package 10D is 500 µm. Further, the plane shape of the semiconductor chip 20 installed in the first insulation layer 32 is a rectangle having an area of 8 mm×8 mm, and the total thickness of the semiconductor chip 20 is 90 µm. Further, the material of the semiconductor chip 20 is silicon, the material of each insulation layer of the semiconductor package 10D is an epoxy resin, and the material of each wiring layer of the semiconductor package 10D is copper (Cu). Further, a glass cloth of IPC type #1015 is used as the glass cloth 40.

From the bottom side of the semiconductor package 10D, the first wiring layer 31 is referred to as "layer 0", the second wiring layer is referred to as "layer 1", the newly inserted 3 wiring layers are referred to as "layer 2", "layer 3", and "layer 4", respectively, the third wiring layer 35 is referred to as "layer 5", and the fourth wiring layer 37 is referred to as "layer 6" for the sake of convenience.

Further, the insulation layer interposed between the layer 0 and the layer 1 is referred to as "layer L01", the insulation layer interposed between the layer 1 and the layer 2 is referred to as "layer L12", the insulation layer interposed between the layer 2 and the layer 3 is referred to as "layer L23", the insulation layer interposed between the layer 3 and the layer 4 is referred to as "layer L34", the insulation layer interposed between the layer 4 and the layer 5 is referred to as "layer L45", the insulation layer interposed between the layer 5 and the layer 6 is referred to as "layer L56", and the insulation layer covering the layer 6 is referred to as "layer SR". In other words, "layer L01" corresponds to the first insulation layer 32, "layer L12", "layer L23", "layer L34" correspond to the newly inserted 3 insulation layers, respectively, "layer L45" corresponds to the second insulation layer 34, "layer L56" corresponds to the third insulation layer 36, and "layer SR" corresponds to the solder resist layer 38.

In the simulation, first, warping is calculated in a state where the glass cloth 40 is installed in none of the seven insulation layers (layers L01-L56 and layer SR) under the temperatures of 25° C. and 260° C. This state is indicated as "initial" in, for example, FIG. 27 and the below-described Table 1. Next, warping relative to the warping of the "initial" state is calculated in a state where the glass cloth 40 is installed in the layer SR under the temperatures of 25° C. and 260° C. This state is indicated as "SR" in, for example, FIG. 27 and the below-described Table 1. Further, warping relative to the warping of the "initial" state is calculated in a state where the glass cloth 40 is installed in the layer SR and the layer L56 under the temperatures of 25° C. and 260° C. This state is indicated as "+L56" in, for example, FIG. 27 and the below-described Table 1. Further, warping relative to the warping of the "initial" state is calculated in a state where the glass cloth 40 is installed in the layer SR, the layer L56, and the layer L45 under the temperatures of 25° C. and 260° C. This state is indicated as "+L45" in, for example, FIG. 27 and the below-described Table 1. Further, warping relative to the warping of the "initial" state is calculated in a state where the glass cloth 40 is installed in the layer SR, the layer L56, the layer 45, and the layer 34 under the temperatures of 25° C. and 260° C. This state is indicated as "+L34" in, for example, FIG. 27 and the below-described Table 1. Further, warping relative to the warping of the "initial" state is calculated in a state where the glass cloth 40 is installed in the layer SR, the layer L56, the layer 45, the layer 34, and the layer 23 under the temperatures of 25° C. and 260° C. This state is indicated as "+L23" in, for example, FIG. 27 and the below-described Table 1. Further, warping relative to the warping of the "initial" state is calculated in a state where the glass cloth 40 is installed in the layer SR, the layer L56, the layer 45, the layer 34, the layer 23, and the layer L12 under the temperatures of 25° C. and 260° C. This state is indicated as "+L12" in, for example, FIG. 27 and the below-described Table 1.

The results of the simulation are indicated in the below-described Table 1, FIG. 27, and FIG. 28. The below-described Table 1 and FIG. 27 indicate the relative values of warping in each of the above-described states in a case where the value of the warping of the "initial" state under the temperatures of 25° C. and 260° C. is assumed as 1. FIG. 28 indicates the rate of change of warping with respect to each of the above-described states.

TABLE 1

|  | INITIAL | SR | +L56 | +L45 | +L34 | +L23 | +L12 |
|---|---|---|---|---|---|---|---|
| 25° C. | 1.000 | 0.974 | 0.952 | 0.919 | 0.882 | 0.850 | 0.819 |
| 260° C. | 1.000 | 0.896 | 0.831 | 0.781 | 0.740 | 0.707 | 0.681 |

Figure 27:
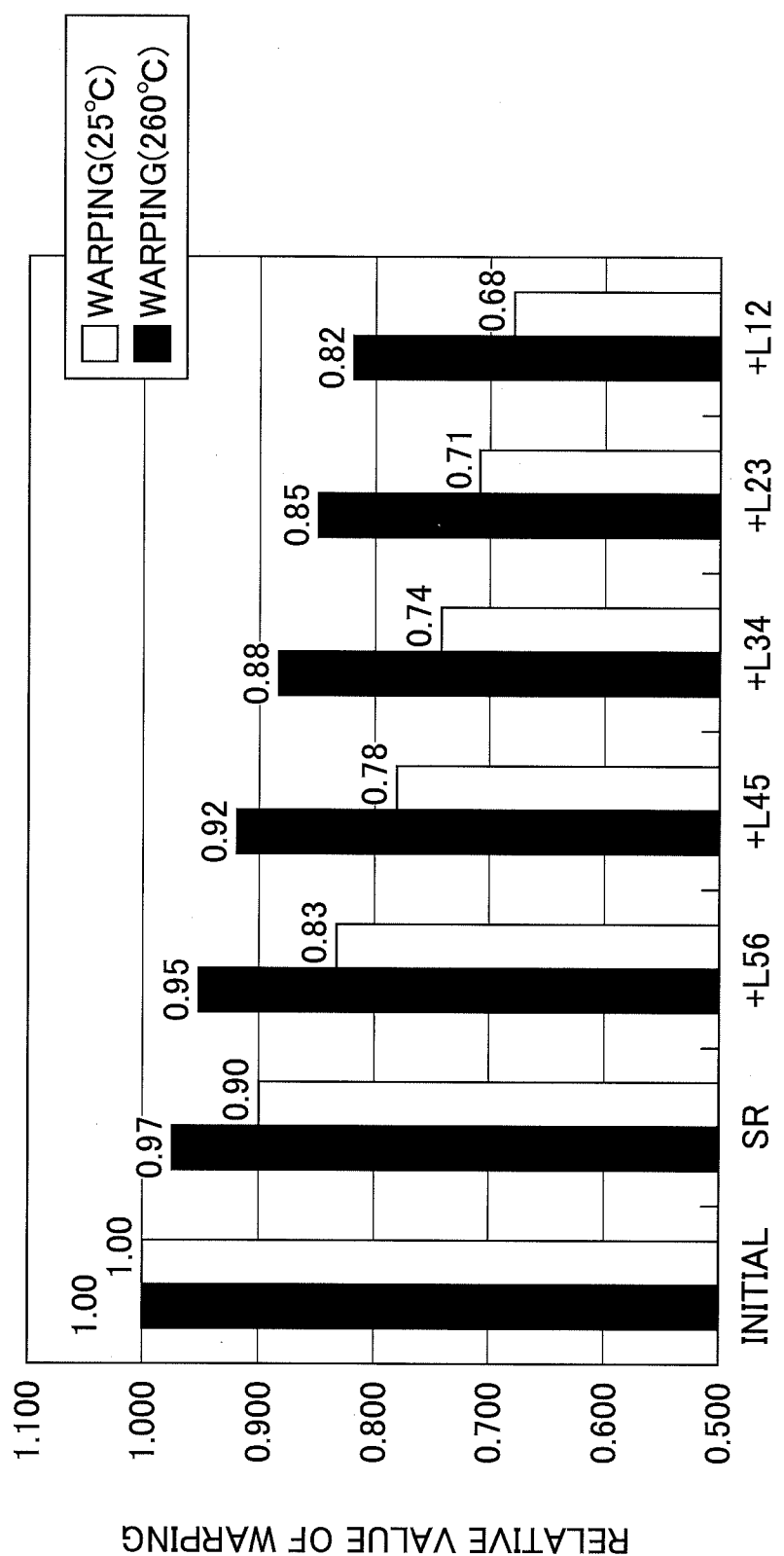
FIGS. 27 and 28 are schematic diagrams illustrating simulations results pertaining to warping.
Figure 28:
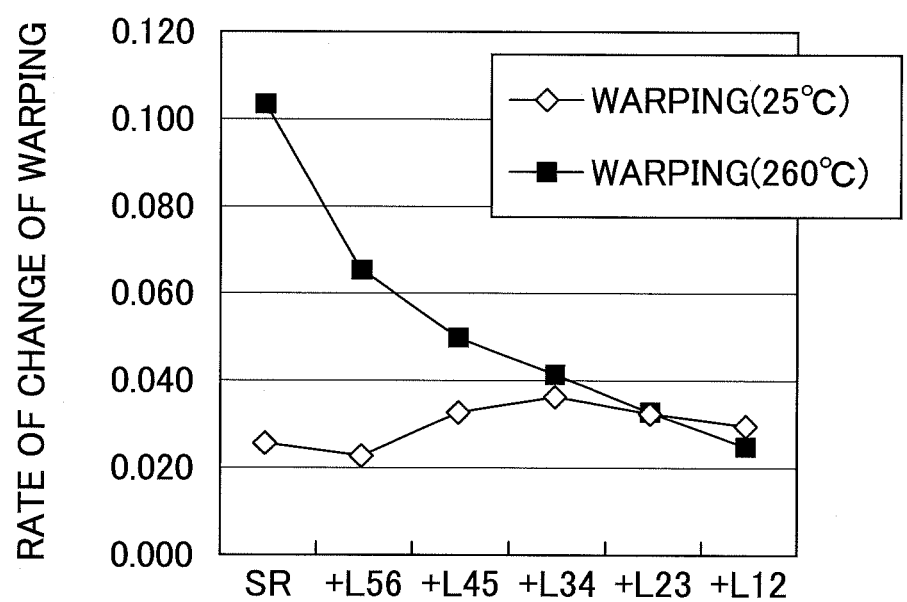

Table 1 and FIG. 27 indicate that the warping of the semiconductor package 10D decreases approximately 3% when the glass cloth 40 is installed only in the solder resist layer 38 (SR) in a case where the temperature is 25° C. (room temperature). Table 1 and FIG. 27 also indicate that the warping of the semiconductor package 10D decreases approximately 10% when the glass cloth 40 is installed only in the solder resist layer 38 (SR) in a case where the temperature is 260° C. (high temperature). Moreover, Table 1 and FIG. 27 indicate that the warping of the semiconductor package 10D further decreases as the glass cloth 40 is installed in more layers. As illustrated in FIG. 28, the warping of the semiconductor package 10D continues to decrease substantially at the same rate as increasing the number of layers in which the glass cloth 40 is installed in a case where the temperature is 25° C. (room temperature). However, in a case where the temperature is 260 (high temperature), the decrease rate of the warping of the semiconductor package 10D becomes greater as the glass cloth 40 is installed in a layer closer toward the solder resist layer 38. In other words, the effect of decreasing the warping of the semiconductor package 10D becomes greater as the glass cloth 40 is installed in a layer closer toward the solder resist layer 38.

Accordingly, it is confirmed that the warping of the semiconductor package 10D can be reduced by installing the glass cloth 40, for example, in the solder resist layer 38 or the third insulation layer 36.

With the above-described embodiment of the present invention, a semiconductor package capable of reducing warping and a method for manufacturing the semiconductor package can be provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention. For example, the modification(s) applied to the second or the third modified examples of the first embodiment of the present invention may also be applied to the first modified example of the first embodiment of the present invention.

What is claimed is:

1. A semiconductor package comprising:
    a semiconductor chip including a circuit forming surface and a side surface;
    a sealing insulation layer that seals the circuit forming surface and the side surface of the semiconductor chip, the sealing insulation layer having a first surface on a side of the circuit forming surface;
    a plurality of wiring layers including a first wiring layer that is formed on the first surface and electrically connected to the semiconductor chip; and
    a plurality of insulation layers including a first insulation layer;
    wherein among the plurality of insulation layers, the first insulation layer is positioned farthest from the sealing insulation layer and is formed of solder resist,
    wherein the plurality of wiring layers and the plurality of insulation layers are formed one on top of the other on the first surface,
    wherein the plurality of wiring layers includes a second wiring layer that is an outermost layer among the plurality of wiring layers and is positioned farthest from the sealing insulation layer,
    wherein the first insulation layer includes an opening that exposes the second wiring layer,
    wherein a reinforcement member is entirely buried only inside the first insulation layer positioned farthest from the sealing insulation layer,
    wherein the reinforcement member is a woven fabric or a non-woven fabric.

2. The semiconductor package as claimed in claim 1, further comprising:
    a first electrode pad including a first electrode pad surface exposed at a second surface of the sealing insulation layer, the second surface being positioned on an opposite side of the first surface of the sealing insulation layer; and
    a penetration wiring that penetrates the sealing insulation layer and is electrically connected to the first wiring layer and the first electrode pad.

3. The semiconductor package as claimed in claim 2,
    wherein the semiconductor chip includes a rear surface positioned on an opposite side of the circuit forming surface,
    wherein the rear surface of the semiconductor chip and the first electrode pad surface of the first electrode pad are flush with the second surface of the sealing insulation layer.

4. The semiconductor package as claimed in claim 2,
    wherein the semiconductor chip includes a rear surface positioned on an opposite side of the circuit forming surface,
    wherein the rear surface of the semiconductor chip is flush with the second surface of the sealing insulation layer,
    wherein the first electrode pad surface of the first electrode pad is more concave than the second surface of the sealing insulation layer.

5. A method for manufacturing a semiconductor package, the method comprising:
    placing a semiconductor chip on a first side of a substrate, the semiconductor chip including a circuit forming surface and a side surface;
    forming a sealing insulation layer on the first side of the substrate, the sealing insulation layer sealing the circuit forming surface and the side surface of the semiconductor chip;
    forming a plurality of wiring layers and a plurality of insulation layers one on top of the other on a first surface of the sealing insulation layer, the first surface being positioned on a side of the circuit forming surface; and
    removing the substrate;
    wherein the plurality of wiring layers include a first wiring layer that is formed on the first surface and electrically connected to the semiconductor chip,
    wherein the plurality of insulation layers include a first insulation layer,
    wherein among the plurality of insulation layers, the first insulation layer is positioned farthest from the sealing insulation layer and is formed of solder resist,
    wherein the plurality of wiring layers includes a second wiring layer that is an outermost layer among the plurality of wiring layers and is positioned farthest from the sealing insulation layer,
    wherein the first insulation layer includes an opening part that exposes the second wiring layer, wherein a reinforcement member is entirely buried only inside the first insulation layer positioned farthest from the sealing insulation layer,
wherein the reinforcement member is a woven fabric or a non-woven fabric.

6. The method as claimed in claim 5, further comprising:
forming a first electrode pad including a first electrode pad surface and a side electrode pad surface on the first side of the substrate before the forming of the sealing insulation layer; and
forming a through-hole between the forming of the sealing insulation layer and the forming of the plurality of wiring layers and the plurality of insulation layers, the through-hole penetrating the sealing insulation layer and exposing the first electrode pad surface of the first electrode pad;
wherein the sealing insulation layer covers the circuit forming surface and the side surface of the semiconductor chip and the first electrode pad surface and the side electrode pad surface of the first electrode pad;
wherein at least one of the plurality of wiring layers is formed inside the through-hole and is electrically connected to the first electrode pad.

7. The semiconductor package as claimed in claim 1, wherein one of the first or the second insulation layer has an insulating resin impregnated in the woven fabric or the non-woven fabric.

8. The semiconductor package as claimed in claim 1,
wherein the semiconductor chip includes a third electrode pad,
wherein a via hole is formed in the first surface of the sealing insulation layer and exposes the third electrode pad,
wherein a via wiring is formed in the via hole and connects the first wiring layer and the third electrode pad.

9. The method as claimed in claim 5, wherein the first insulation layer is formed by impregnating an insulating resin in the woven fabric or the non-woven fabric.

10. The method as claimed in claim 5, further comprising:
forming a third electrode pad on the semiconductor chip;
forming a via hole in the first surface of the sealing insulation layer, the via hole exposing the third electrode pad; and
forming a via wiring in the via hole, the via wiring connecting the first wiring layer and the third electrode pad.

11. A semiconductor package comprising:
a semiconductor chip including a circuit forming surface, a rear surface and a side surface;
a sealing insulation layer that seals the circuit forming surface and the side surface of the semiconductor chip, the sealing insulation layer having a first surface on a side of the circuit forming surface and a second surface positioned on an opposite side of the first surface of the sealing insulation layer;
a plurality of wiring layers including a first wiring layer that is formed on the first surface and electrically connected to the semiconductor chip;
a plurality of insulation layers including a first insulation layer;
a first electrode pad including a first electrode pad surface that is exposed at the second surface of the sealing insulation layer, a second electrode pad surface positioned on an opposite side of the first electrode pad surface, and a side electrode pad surface; and
a penetration wiring that penetrates the sealing insulation layer and is electrically connected to the first wiring layer and the second electrode pad surface;
wherein among the plurality of insulation layers, the first insulation layer is positioned farthest from the sealing insulation layer and is formed of solder resist,
wherein the plurality of wiring layers and the plurality of insulation layers are formed one on top of the other on the first surface,
wherein the plurality of wiring layers includes a second wiring layer that is an outermost layer among the plurality of wiring layers and is positioned farthest from the sealing insulation layer,
wherein the first insulation layer includes an opening that exposes the second wiring layer,
wherein a reinforcement member is entirely buried only inside the first insulation layer positioned farthest from the sealing insulation layer,
wherein the rear surface of the semiconductor chip is flush with the second surface of the sealing insulation layer,
wherein the side electrode pad surface and the second electrode pad surface are covered by the sealing insulation layer.

12. The semiconductor package as claimed in claim 11,
wherein the rear surface of the semiconductor chip and the first electrode pad surface are flush with the second surface of the sealing insulation layer.

13. The semiconductor package as claimed in claim 11,
wherein the first electrode pad surface of the first electrode pad is more concave than the second surface of the sealing insulation layer.

14. The semiconductor package as claimed in claim 11, wherein the first insulation layer has an insulating resin impregnated in a woven fabric or a non-woven fabric.

15. The semiconductor package as claimed in claim 11,
wherein the semiconductor chip includes a third electrode pad,
wherein a via hole is formed in the first surface of the sealing insulation layer and exposes the third electrode pad,
wherein a via wiring is formed in the via hole and connects the first wiring layer and the third electrode pad.

16. A method for manufacturing a semiconductor package, the method comprising:
placing a semiconductor chip on a first side of a substrate, the semiconductor chip including a circuit forming surface and a side surface;
forming a sealing insulation layer on the first side of the substrate, the sealing insulation layer sealing the circuit forming surface and the side surface of the semiconductor chip;
forming a plurality of wiring layers and a plurality of insulation layers one on top of the other on a first surface of the sealing insulation layer, the first surface being positioned on a side of the circuit forming surface;
forming a first electrode pad on the first side of the substrate before the forming of the sealing insulation layer, the first electrode pad including a first electrode pad surface, a second electrode pad surface on an opposite side of the first electrode pad surface, and a side electrode pad surface;
forming a through-hole between the forming of the sealing insulation layer and the forming of the plurality of wiring layers and the plurality of insulation layers, the through-hole penetrating the sealing insulation layer and exposing the second electrode pad surface of the first electrode pad; and
exposing the first electrode pad surface by removing the substrate;

wherein the plurality of wiring layers include a first wiring layer that is formed on the first surface and electrically connected to the semiconductor chip,
wherein the plurality of insulation layers include a first insulation layer,
wherein among the plurality of insulation layers, the first insulation layer is positioned farthest from the sealing insulation layer and is formed of solder resist,
wherein the plurality of wiring layers includes a second wiring layer that is an outermost layer among the plurality of wiring layers and is positioned farthest from the sealing insulation layer,
wherein the first insulation layer includes an opening part that exposes the second wiring layer,
wherein a reinforcement member is entirely buried only inside the first insulation layer positioned farthest from the sealing insulation layer or the second insulation layer positioned second farthest from the sealing insulation layer,
wherein the sealing insulation layer covers the circuit forming surface and the side surface of the semiconductor chip and the second electrode pad surface and the side electrode pad surface of the first electrode pad;
wherein at least one of the plurality of wiring layers is formed inside the through-hole and is electrically connected to the first electrode pad.

17. The method as claimed in claim 16,
wherein the semiconductor chip includes a rear surface positioned on an opposite side of the circuit forming surface,
wherein the rear surface of the semiconductor chip and the first electrode pad surface of the first electrode pad are flush with the second surface of the sealing insulation layer.

18. The method as claimed in claim 16,
wherein the semiconductor chip includes a rear surface positioned on an opposite side of the circuit forming surface,
wherein the rear surface of the semiconductor chip is flush with the second surface of the sealing insulation layer,
wherein the first electrode pad surface of the first electrode pad is more concave than the second surface of the sealing insulation layer.

19. The method as claimed in claim 16, wherein the first insulation layer is formed by impregnating an insulating resin in a woven fabric or a non-woven fabric.

20. The method as claimed in claim 16, further comprising:
forming a third electrode pad on the semiconductor chip;
forming a via hole in the first surface of the sealing insulation layer, the via hole exposing the third electrode pad,
forming a via wiring in the via hole, the via wiring connecting the first wiring layer and the third electrode pad.

* * * * *